(12) United States Patent  
Stevenson et al.

(10) Patent No.: US 10,374,324 B2  
(45) Date of Patent: Aug. 6, 2019

(54) ANTENNA HAVING MEMS-TUNED RF RESONATORS

(71) Applicant: Kymeta Corporation, Redmond, WA (US)

(72) Inventors: Ryan Stevenson, Woodinville, WA (US); Kianoush Naeli, Kirkland, WA (US); Mohsen Sazegar, Kirkland, WA (US); Benjamin Sikes, Seattle, WA (US); Timothy Mason, Kirkland, WA (US); Erik Shipton, Kirkland, WA (US); Nathan Kundtz, Kirkland, WA (US)

(73) Assignee: KYMETA CORPORATION, Redmond, WA (US)

( * ) Notice: Subject to any disclaimer, the term of this patent is extended or adjusted under 35 U.S.C. 154(b) by 155 days.

(21) Appl. No.: 15/485,069

(22) Filed: Apr. 11, 2017

(65) Prior Publication Data

US 2017/0302004 A1    Oct. 19, 2017

Related U.S. Application Data

(60) Provisional application No. 62/323,513, filed on Apr. 15, 2016, provisional application No. 62/370,093, filed on Aug. 2, 2016.

(51) Int. Cl.
| | |
|---|---|
| *H01Q 9/00* | (2006.01) |
| *H01Q 21/06* | (2006.01) |
| *H01Q 3/26* | (2006.01) |
| *H01Q 3/44* | (2006.01) |
| *H01Q 21/00* | (2006.01) |

(Continued)

(52) U.S. Cl.
CPC ......... *H01Q 21/065* (2013.01); *B81B 3/0086* (2013.01); *B81C 1/00158* (2013.01); *H01G 5/011* (2013.01); *H01G 5/16* (2013.01); *H01Q 3/2676* (2013.01); *H01Q 3/44* (2013.01); *H01Q 21/0031* (2013.01); *H01Q 21/30* (2013.01); *H03J 3/02* (2013.01); *B81B 2201/0221* (2013.01); *B81B 2201/0271* (2013.01); *B81B 2203/0127* (2013.01); *B81B 2203/04* (2013.01);

(Continued)

(58) Field of Classification Search  
CPC ...... H01Q 7/005; H01Q 13/103; H01Q 15/02; H01Q 15/12; H01Q 19/06; H01Q 13/10  
USPC ........ 343/745, 754, 756, 757, 767, 770, 753  
See application file for complete search history.

(56) References Cited

U.S. PATENT DOCUMENTS

| | | |
|---|---|---|
| 7,755,547 B2 | 7/2010 | Rahola et al. |
| 8,362,965 B2 | 1/2013 | Henderson |

(Continued)

OTHER PUBLICATIONS

PCT Appln. No. PCT/US17/027257, International Search Report and Written Opinion dated Oct. 12, 2017, 22 pgs.

(Continued)

*Primary Examiner* — Joseph J Lauture  
(74) *Attorney, Agent, or Firm* — Womble Bond Dickinson (US) LLP

(57) ABSTRACT

An antenna having radio-frequency (RF) resonators and methods for fabricating the same are described. In one embodiment, the antenna comprises a physical antenna aperture having an array of antenna elements, where the array of antenna elements includes a plurality of radio-frequency (RF) resonators, with each RF resonator of the plurality of RF resonators having an RF radiating element with a microelectromchanical systems (MEMS) device.

25 Claims, 31 Drawing Sheets

(51) Int. Cl.
    *H01Q 21/30*     (2006.01)
    *B81B 3/00*     (2006.01)
    *B81C 1/00*     (2006.01)
    *H01G 5/011*     (2006.01)
    *H01G 5/16*     (2006.01)
    *H03J 3/02*     (2006.01)
    *H01Q 7/00*     (2006.01)
    *H01Q 13/10*     (2006.01)

(52) U.S. Cl.
    CPC ...... *B81C 2203/0118* (2013.01); *H01Q 7/005* (2013.01); *H01Q 13/103* (2013.01)

(56) References Cited

U.S. PATENT DOCUMENTS

| | | | |
|---|---|---|---|
| 9,018,717 | B2 | 4/2015 | Knipe et al. |
| 9,076,808 | B2 | 7/2015 | Gaddi et al. |
| 2003/0020173 | A1* | 1/2003 | Huff ............... B81B 7/0064 257/774 |
| 2004/0008140 | A1 | 1/2004 | Sengupta et al. |
| 2006/0077155 | A1 | 4/2006 | Chui et al. |
| 2006/0125703 | A1 | 6/2006 | Ma et al. |
| 2006/0284774 | A1 | 12/2006 | Salsman |
| 2007/0070576 | A1 | 3/2007 | Lynch et al. |
| 2007/0216598 | A1 | 9/2007 | Fabrega-Sanchez et al. |
| 2007/0256917 | A1 | 11/2007 | Oberhammer et al. |
| 2013/0241770 | A1 | 9/2013 | Legay et al. |
| 2014/0300404 | A1 | 10/2014 | Gaddi et al. |
| 2015/0318618 | A1 | 11/2015 | Chen et al. |
| 2016/0055980 | A1 | 2/2016 | Knipe et al. |
| 2017/0019137 | A1 | 1/2017 | Parkhurst et al. |

OTHER PUBLICATIONS

International Preliminary Report on Patentability received for PCT Patent Application No. PCT/US2017/027257, dated Oct. 25, 2018, 10 pages.

* cited by examiner

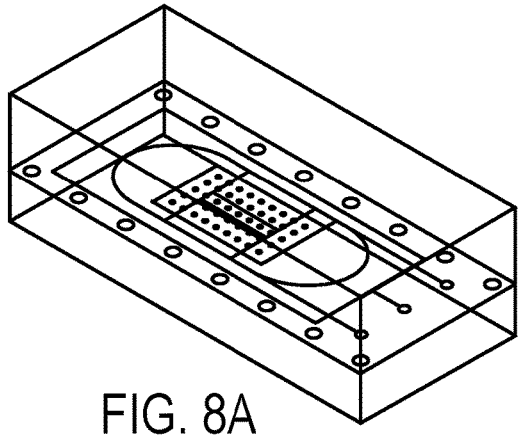 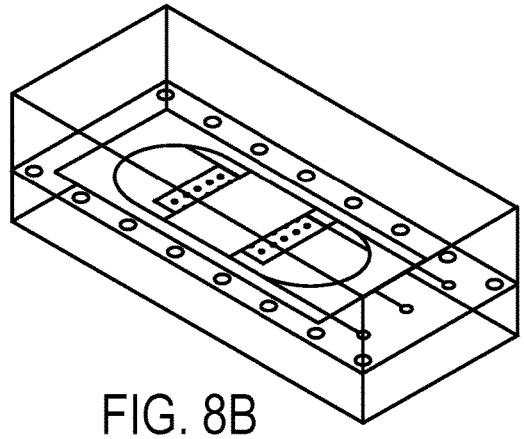
FIG. 8A  FIG. 8B
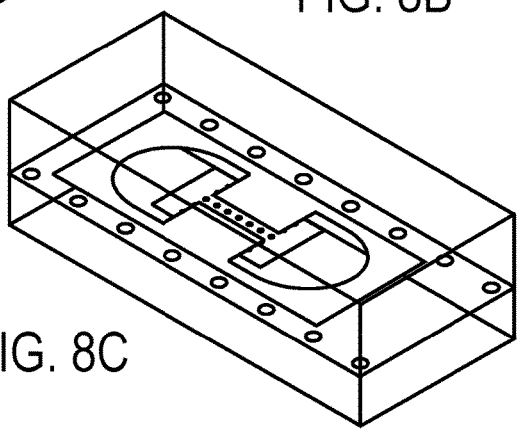
FIG. 8C
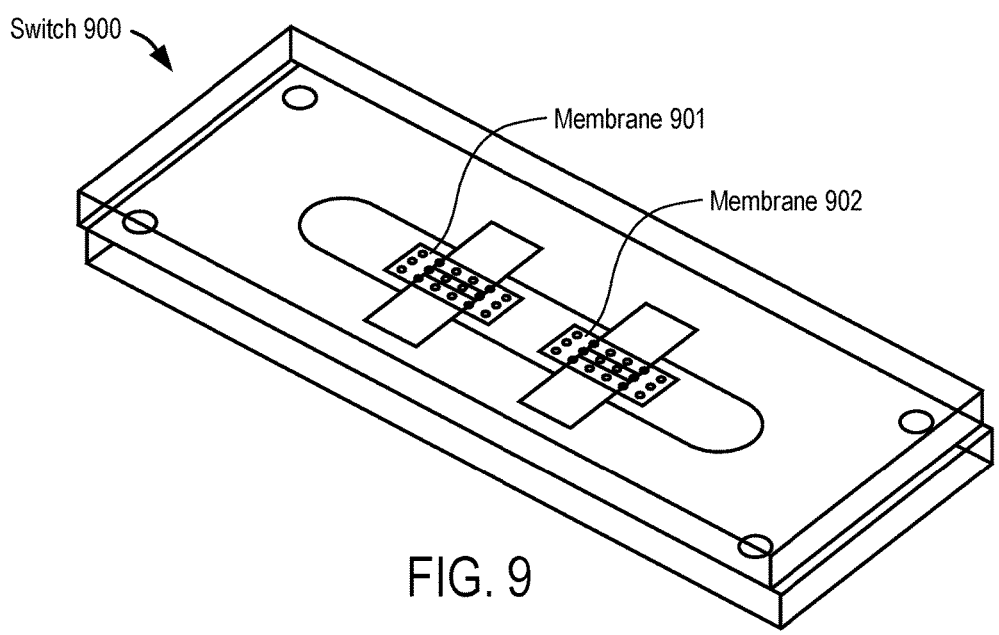
FIG. 9

Photo and Pattern

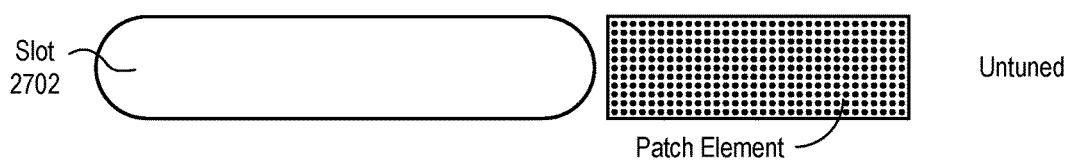
FIG. 27A  Untuned
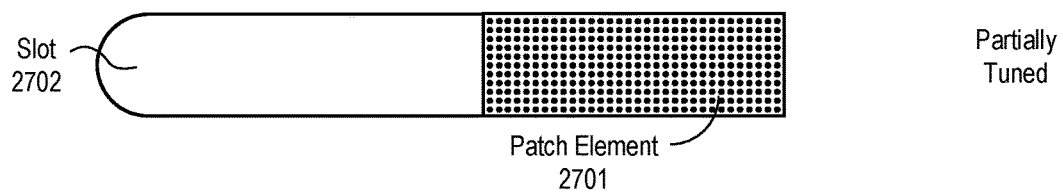
FIG. 27B  Partially Tuned
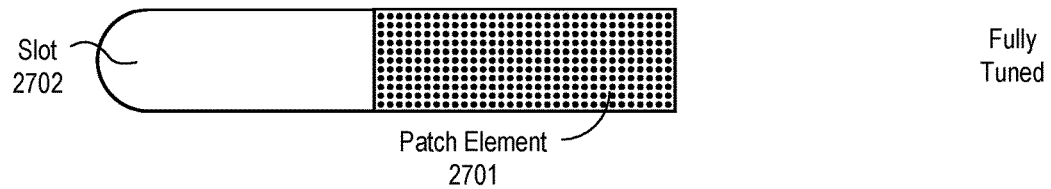
FIG. 27C  Fully Tuned

ANTENNA HAVING MEMS-TUNED RF RESONATORS

PRIORITY

The present patent application claims priority to and incorporates by reference the corresponding provisional patent application Ser. No. 62/323,513, titled, "Holographic Metamaterial Antenna Using MEMS-Tuned RF Resonators," filed on Apr. 15, 2016 and provisional patent application Ser. No. 62/370,093, titled, "MEMS-Tuned RF Resonators with Push-Pull Parallel Plates and the Method of Fabrication," filed on Aug. 2, 2016.

FIELD OF THE INVENTION

Embodiments of the invention relate to antennas for wireless communication; more particularly, embodiments of the invention relate to an antenna that includes microelectromechanical systems (MEMS)-tuned radio-frequency (RF) resonators.

BACKGROUND OF THE INVENTION

Many existing antennas include resonator elements. The resonator elements are often tuned by introducing phase delay elements that have high cost or, more recently, by tuning anisotropic liquid crystals (LCs). For example, LCs have been used as the tuning element in metamaterial holographic antennas.

The use of LCs adds complexity to their implementations in various designs. For example, LCs may be limited in the speed at which they can be switched, operational temperature ranges, and long term environmental reliability. More specifically, because of the added complexity in using an LC as a tuning medium for antennas means that system designers have to deal with issues regarding: temperature dependence, RF losses, switching speed, reliability, and capacitive tuning. With respect to temperature dependence, the LC must be warmed to meet tracking rates for cold operation, while its warm operation is limited by the LC clearing point. With respect to switching speed, the LC is a long-chain hydrocarbon molecule that is being physically rotated in a viscous medium, and as a result, the switching speeds with LC are limited to the 1-10 msec range. With respect to reliability, some types of LCs are very sensitive to ultraviolet (UV) light, water, and heat. Also, the voltage holding ratio is shown to degrade significantly with accelerated aging, which adds complexity into the design to ensure reliable performance and operation in the field. In view of these issues, it may be desirable to seek alternatives to LCs for use in antennas.

SUMMARY OF THE INVENTION

An antenna having MEMS-tuned radio-frequency (RF) resonators and methods for fabricating the same are described. In one embodiment, the antenna comprises a physical antenna aperture having an array of antenna elements, where the array of antenna elements includes a plurality of radio-frequency (RF) resonators, with each RF resonator of the plurality of RF resonators having an RF radiating element with a microelectromechanical systems (MEMS) device.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 8A-C illustrate a three-dimensional visualization of one embodiment of a push-pull MEMS switch.

FIG. 9 illustrates one embodiment of a MEMS switch that includes multiple membranes.

FIGS. 27A-C illustrate an example of slot length tuning.

DETAILED DESCRIPTION

Figure 1:
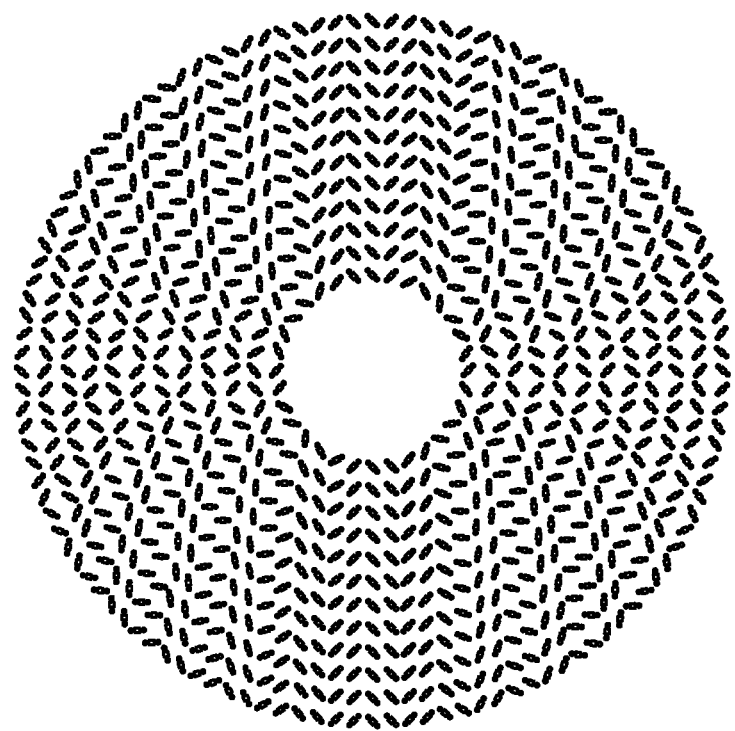
FIG. 1 illustrates an aperture having one or more arrays of antenna elements placed in concentric rings around an input feed of the cylindrically fed antenna.

In the following description, numerous details are set forth to provide a more thorough explanation of embodiments of the present invention. It will be apparent, however, to one skilled in the art, that the present invention may be practiced without these specific details. In other instances, well-known structures and devices are shown in block diagram form, rather than in detail, in order to avoid obscuring the present invention.

Embodiments of the invention include an RF tunable resonator and a holographic antenna that includes such RF tunable resonators. In one embodiment, the capacitance or inductance of the resonator is adjusted through the use of microelectromechanical systems (MEMS).

In one embodiment, an antenna includes RF tunable resonators as antenna elements that are positioned in one or more arrays. The RF tunable resonators are controlled and operate together to form a beam for the frequency band for use in holographic beam steering. In one embodiment, each array of antenna elements comprises a tunable slotted array of antenna elements having multiple irises and multiple patches, where each of the patches is co-located over and separated from one of the multiple irises, forming a patch/iris pair. Each patch/iris pair is turned off or on based on application of a voltage to the patch in the pair according to a control pattern from a controller, thereby causing generation of a beam. In one embodiment, each resonator is able to push or pull one of the patches in various ways using the MEMS to change the capacitance or inductance of the resonator.

The following disclosure identifies several concepts for implementing a patch/iris pair that performs the necessary tuning required to produce the holographic beam forming effect, while increasing tunability and radiation efficiency versus using liquid crystal.

Antenna Embodiments

The RF tunable resonators described herein may be used with various antennas, including flat panel antennas. Embodiments of such flat panel antennas are disclosed. The flat panel antennas include one or more arrays of antenna elements on an antenna aperture. In one embodiment, the flat panel antenna is a cylindrically fed antenna that includes matrix drive circuitry to uniquely address and drive each of the antenna elements that are not placed in rows and columns. Note that the feed need not be circular. In one embodiment, the elements are placed in rings.

In one embodiment, the antenna aperture having the one or more arrays of antenna elements is comprised of multiple segments coupled together. When coupled together, the combination of the segments form closed concentric rings of antenna elements. In one embodiment, the concentric rings are concentric with respect to the antenna feed.

In one embodiment, the flat panel antenna is part of an antenna system used for satellite earth stations. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering antenna elements; and (3) a control structure to command formation of an adjustable radiation field (beam) from the scattering antenna elements using holographic principles.

Examples of Wave Guiding Structures

FIG. 1 illustrates an aperture having one or more arrays of antenna elements placed in concentric rings around an input feed of the cylindrically fed antenna. Note that the RF resonators described herein may be used in antennas that do not include a cylindrical feed.

In one embodiment, the antenna includes a coaxial feed that is used to provide a cylindrical wave feed. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, the antenna includes one or more arrays of antenna elements and the antenna elements comprise a group of patch antennas. This group of patch antennas comprises an array of scattering elements.

In one embodiment, the feed geometry of this antenna system allows the antenna elements to be positioned at forty-five degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

Figure 2:
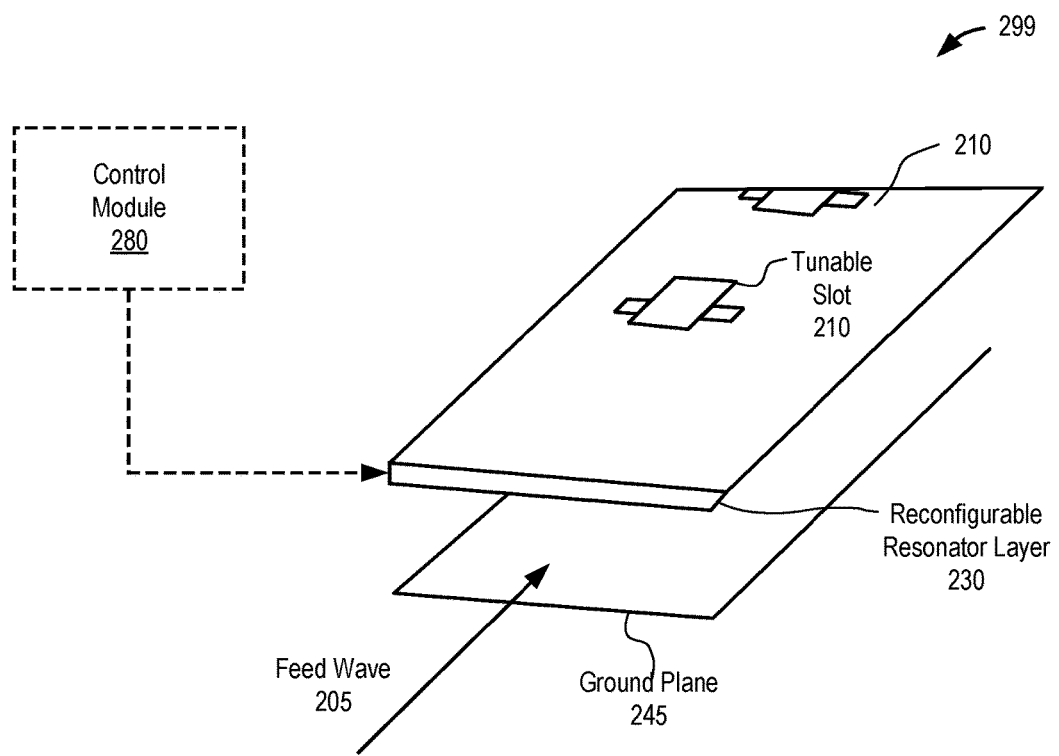
FIG. 2 illustrates a perspective view of one row of antenna elements that includes a ground plane and a reconfigurable resonator layer.

FIG. 2 illustrates a perspective view of one row of antenna elements that includes a ground plane and a reconfigurable resonator layer. Reconfigurable resonator layer 230 includes an array of tunable slots 210. The array of tunable slots 210 can be configured to point the antenna in a desired direction.

Each of the tunable slots can be tuned/adjusted by varying a voltage across a space between the iris and patch associated with each slot.

Control module 280 is coupled to reconfigurable resonator layer 230 to modulate the array of tunable slots 210 by varying the voltage across gap between the iris and patch associated with each slot in FIG. 2. Control module 280 may include a Field Programmable Gate Array ("FPGA"), a microprocessor, a controller, System-on-a-Chip (SoC), or other processing logic. In one embodiment, control module 280 includes logic circuitry (e.g., multiplexer) to drive the array of tunable slots 210. In one embodiment, control module 280 receives data that includes specifications for a holographic diffraction pattern to be driven onto the array of tunable slots 210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram} = w_{in} * w_{out}$, with $w_{in}$ as the wave equation in the waveguide and $w_{out}$ the wave equation on the outgoing wave.

Figure 3:
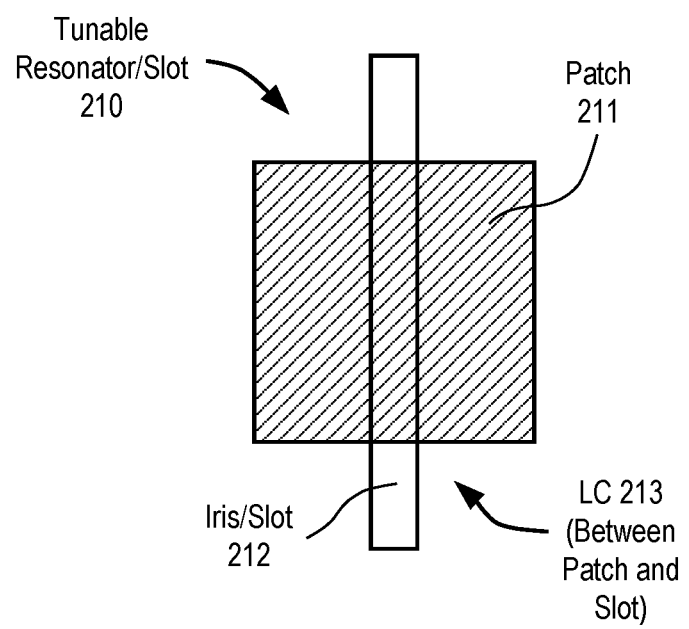
FIG. 3 illustrates one embodiment of a tunable resonator/slot.

FIG. 3 illustrates one embodiment of a tunable resonator/slot 210. Tunable slot 210 includes an iris/slot 212, a radiating patch 211, and liquid crystal 213 disposed between iris 212 and patch 211. In one embodiment, radiating patch 211 is co-located with iris 212.

A voltage between patch 211 and iris 212 can be modulated to tune the resonator (e.g., tunable resonator/slot 210). Adjusting the voltage across the gap between varies the capacitance of a slot (e.g., tunable resonator/slot 210). Accordingly, the reactance of a slot (e.g., tunable resonator/slot 210) can be varied by changing the capacitance. The resonant frequency of slot 210 affects the energy radiated from feed wave 205 propagating through the waveguide. As an example, if feed wave 205 is 20 GHz, the resonant frequency of a slot 210 may be adjusted (by varying the capacitance) to 17 GHz so that the slot 210 couples substantially no energy from feed wave 205. Or, the resonant frequency of a slot 210 may be adjusted to 20 GHz so that the slot 210 couples energy from feed wave 205 and radiates that energy into free space. Although the examples given are binary (fully radiating or not radiating at all), full gray scale control of the reactance, and therefore the resonant frequency of slot 210 is possible with voltage variance over a multi-valued range. Hence, the energy radiated from each slot 210 can be finely controlled so that detailed holographic diffraction patterns can be formed by the array of tunable slots.

In one embodiment, tunable slots in a row are spaced from each other by $\lambda/5$. Other spacings may be used. In one embodiment, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/6.3$). In another embodiment, each tunable slot in a row is spaced from the closest tunable slot in an adjacent row by $\lambda/3$.

Figure 4:
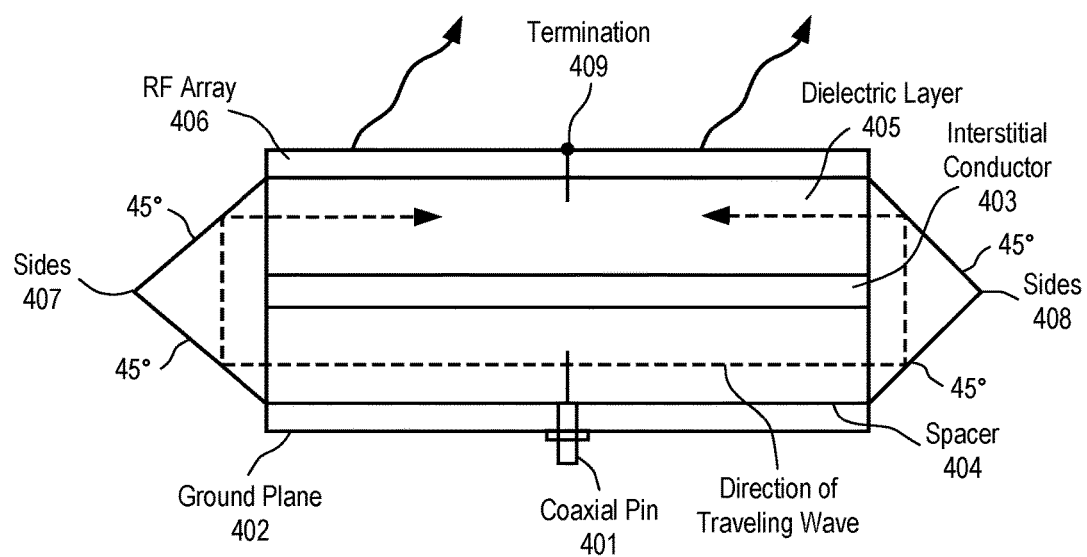
FIG. 4 illustrates a side view of one embodiment of a cylindrically fed antenna structure.

FIG. 4 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 4 includes a coaxial feed.

Referring to FIG. 4, a coaxial pin 401 is used to excite the field on the lower level of the antenna. In one embodiment, coaxial pin 401 is a 50Ω coax pin that is readily available. Coaxial pin 401 is coupled (e.g., bolted) to the bottom of the antenna structure, which is conducting ground plane 402.

Separate from conducting ground plane 402 is interstitial conductor 403, which is an internal conductor. In one embodiment, conducting ground plane 402 and interstitial conductor 403 are parallel to each other. In one embodiment, the distance between ground plane 402 and interstitial conductor 403 is 0.1-0.15". In another embodiment, this distance may be $\Delta/2$, where $\lambda$ is the wavelength of the travelling wave at the frequency of operation.

Ground plane 402 is separated from interstitial conductor 403 via a spacer 404. In one embodiment, spacer 404 is a foam or air-like spacer. In one embodiment, spacer 404 comprises a plastic spacer.

On top of interstitial conductor 403 is dielectric layer 405. In one embodiment, dielectric layer 405 is plastic. The purpose of dielectric layer 405 is to slow the travelling wave relative to free space velocity. In one embodiment, dielectric layer 405 slows the travelling wave by 30% relative to free space. In one embodiment, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 405, such as periodic sub-wavelength metallic structures that can be machined or lithographically defined, for example.

An RF-array 406 that includes tunable slots with patch/iris pairs is on top of dielectric 405. In one embodiment, the distance between interstitial conductor 403 and RF-array 606 is 0.1-0.15". In another embodiment, this distance may be $\lambda_{eff}/2$, where $\lambda_{eff}$ is the effective wavelength in the medium at the design frequency.

The antenna includes sides 407 and 408. Sides 407 and 408 are angled to cause a travelling wave feed from coax pin 401 to be propagated from the area below interstitial conductor 403 (the spacer layer) to the area above interstitial conductor 403 (the dielectric layer) via reflection. In one embodiment, the angle of sides 407 and 408 are at 45° angles. In an alternative embodiment, sides 407 and 408 could be replaced with a continuous radius to achieve the reflection. While FIG. 4 shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers. Note that in another alternative embodiment, sides 407 and 408 are replaced by multiple steps.

In operation, when a feed wave is fed in from coaxial pin 401, the wave travels outward concentrically oriented from coaxial pin 401 in the area between ground plane 402 and interstitial conductor 403. The concentrically outgoing waves are reflected by sides 407 and 408 and travel inwardly in the area between interstitial conductor 403 and RF array 406. The reflection from the edge of the circular perimeter causes the wave to remain in phase (i.e., it is an in-phase reflection). The travelling wave is slowed by dielectric layer 405. At this point, the travelling wave starts interacting and exciting with elements in RF array 406 to obtain the desired scattering.

To terminate the travelling wave, a termination 409 is included in the antenna at the geometric center of the antenna. In one embodiment, termination 409 comprises a pin termination (e.g., a 50Ω pin). In another embodiment, termination 409 comprises an RF absorber that terminates unused energy to prevent reflections of that unused energy back through the feed structure of the antenna. These could be used at the top of RF array 406.

Figure 5:
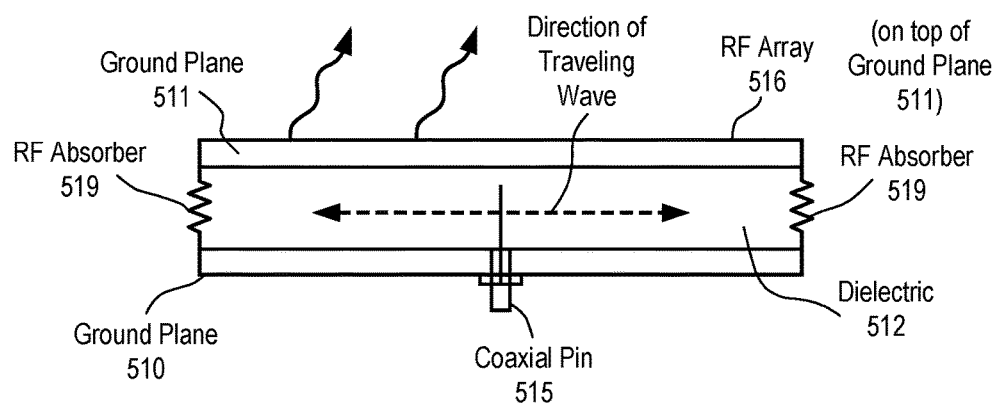
FIG. 5 illustrates another embodiment of the antenna system with an outgoing wave.

FIG. 5 illustrates another embodiment of the antenna system with an outgoing wave. Referring to FIG. 5, two ground planes 510 and 511 are substantially parallel to each other with a dielectric layer 512 (e.g., a plastic layer, etc.) in between ground planes. RF absorbers 519 (e.g., resistors) couple the two ground planes 510 and 511 together. A coaxial pin 515 (e.g., 50Ω) feeds the antenna. An RF array 516 is on top of dielectric layer 512 and ground plane 511.

In operation, a feed wave is fed through coaxial pin 515 and travels concentrically outward and interacts with the elements of RF array 516.

Array of Wave Scattering Elements

RF array 406 of FIG. 4 and RF array 516 of FIG. 5 include a wave scattering subsystem that includes a group of patch antennas (i.e., scatterers) that act as radiators. This group of patch antennas comprises an array of scattering elements. Each patch antenna comprises a patch and iris that form an RF resonator. The following discloses multiple embodiments of MEMS-based RF resonators. In one embodiment, each RF resonator has an RF radiating element with and/or containing a microelectromechanical systems (MEMS) device.

In one embodiment, an RF resonator has a resonance frequency that is tuned between different known levels by utilizing the MEMS push-pull parallel plate tunable capacitor (capacitive switch). In one embodiment, the change of capacitance is realized by pushing and pulling a suspended plate (e.g., patch membrane), into contact with two electrodes with opposite polarities, or at two different voltages, located above and below the plate (patch membrane). In another embodiment, the change of capacitance is realized by pushing and pulling a suspended plate (e.g., patch membrane), into close proximity with two electrodes with opposite polarities, or at two different voltages, located above and below the plate (patch membrane). In yet another embodiment, the change of capacitance is realized by pushing and pulling a suspended plate (e.g., patch membrane), into close proximity or contact with two electrodes with opposite polarities, or at two different voltages, located above and below the plate (patch membrane). That is, the push-pull MEMS tunable capacitor design uses two separate substrates and the voltage level between the two is adjusted to change the capacitance.

The suspended membrane inserts a capacitive impedance in the RF path between the two disconnected resonator ends, which are located on one side of membrane and function as one of the opposite electrodes in direct current (DC). The capacitance is at the high level when the membrane is pushed into contact with or close proximity of the resonator ends, and it is at the low level when the membrane is pulled to the opposite electrode and the gap between the membrane and the resonator ends is maximized. Further levels of capacitance change, i.e., more degree of freedom in tuning the resonance frequency (gray shading), is achieved by utilizing multiple membranes over the disconnected resonator ends.

Example methods for fabrication of the MEMS push-pull tunable capacitor are described. One fabrication method is compatible with the standard surface micromachining and with the liquid crystal display (LCD) manufacturing processes. In one embodiment, the opposite electrodes are fabricated on two separate substrates. On one of the substrates, the suspended membrane is fabricated using a sacrificial layer and metal deposition over that layer. After releasing the sacrificial layer, the two substrates are aligned and attached together, with a gap between them. The size of gap is controlled by placing spacers between the two substrates.

This resonator design may be used in a low cost electrically steerable antenna for mobile satellite communications. The push-pull design provides an excellent control over the resonance frequency change, with a high reliability. The fabrication method provides a relatively simple way for producing the MEMS structures in large volume and high yield, compatible with LCD manufacturing.

In one embodiment, the push-pull electrodes hold the membrane at two known states, preventing it from erroneous and unwanted movements, thus decreasing the sensitivity of resonator to the vibration and shocks. Also, the bi-state push-pull design makes the MEMS structure less vulnerable to the degradation of the membrane stiffness over time, resulting in less susceptibility to the membrane metal fatigue. On the other hand, attraction to the opposite electrode can be used to overcome the stiction of membrane to the surface, which is one of the biggest challenges in the MEMS parallel plate fabrication and operation, as well as to overcome the problems that can be created by wrinkling or dislodging of the membrane over time. In one embodiment, the push-pull design also removes or relaxes the requirements for the restoring spring, for pushing the membrane away from the resonator electrode.

Figure 6A:
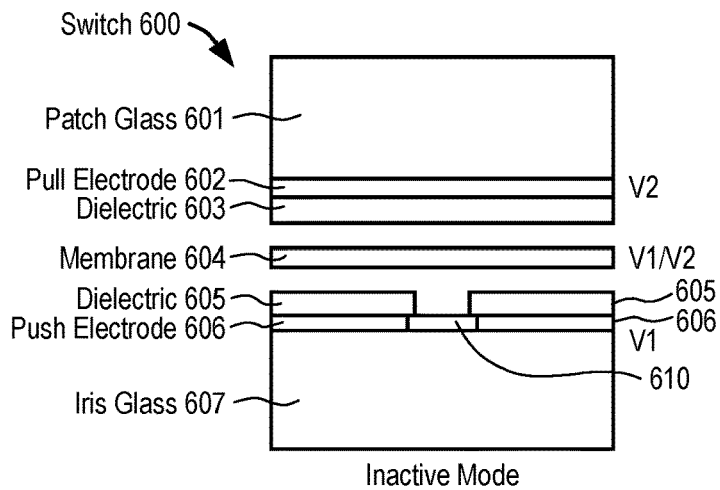
FIGS. 6A-C illustrate the operation of one embodiment of a push-pull MEMS switch
Figure 6B:
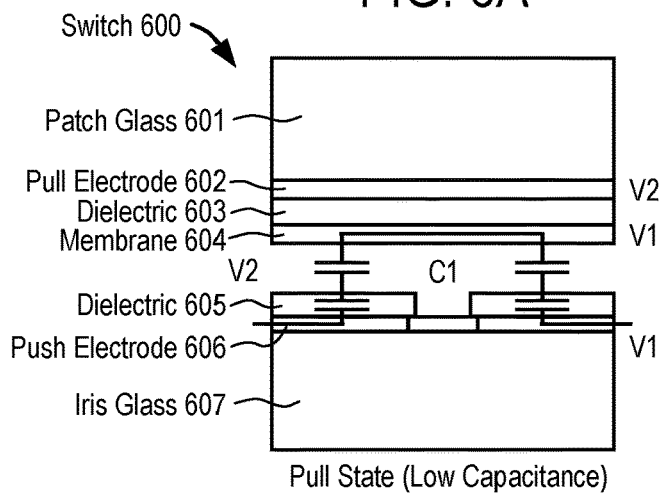
Figure 6C:
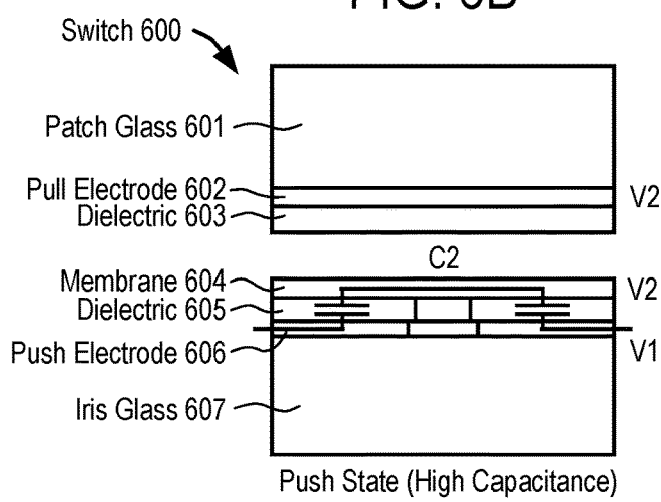

FIGS. 6A-C illustrate the operation of one embodiment of a push-pull MEMS switch (tunable capacitor). Referring to FIGS. 6A-6C, switch 600 comprises a patch substrate (e.g., glass or any material, solid or composite with the desired RF transmission characteristics) 601. A pull electrode 602 is attached to patch glass 601. A dielectric layer 603 is attached to electrode 602. Switch 600 also includes iris substrate (e.g., glass) 607. A push electrode 606 is coupled to iris substrate 607. A dielectric layer 605 is attached to electrode 606 as well as to iris substrate 607 in a centrally located area 610 of push electrode 606. Between dielectric layers 603 and 605 is a gap with a membrane 604 located therebetween. Because of the gap, push electrode 606 may be considered a pair of electrodes. Membrane 604 may comprise conductive or semi-conductive materials (e.g., copper, aluminum, silicon, etc.), while dielectric layers 603 and 605 may comprises, for example, silicon nitride, silicon oxide, etc.

FIG. 6A illustrates the inactive mode of switch 600. Referring to FIG. 6A, switch 600 is in the unpowered mode (storage mode) and membrane 604 is suspended between pull electrode 602 and push electrode 606, on patch substrate 601 and iris substrate 607, respectively.

FIG. 6B illustrates the pull state. Referring to FIG. 6B, in the pull state, membrane 604 is pulled-in to pull electrode 602, creating a large gap between membrane 604 and push electrode 606, thus inserting a small capacitance in the resonator RF path passing both parts of push electrode 606.

FIG. 6C illustrates the push state of switch 600. Referring to FIG. 6C, in the push state, membrane 604 is attached to push electrode 606, increasing the amount of capacitance in the resonator and consequently decreasing the resonance frequency. Dielectric layer 605 over push electrode 606 prevents the electrical short in DC, decreases the amount of voltage for attracting membrane 604 to push electrode 606 (aka, the pull-in voltage), and, when needed, makes the separation of membrane 604 and electrode 606 less effortful.

In one embodiment, the voltage on membrane 604 is toggled between the two values, V1 and V2, as shown in FIGS. 6A-6C, while the voltages on electrodes 602 and 606 are always constant at one of the two values. In one embodiment, the difference between V1 and V2 is larger than the amount of pull-in voltage for membrane 604, and the pull-in voltage is a threshold voltage beyond which the attraction force towards pull electrode 602 exceeds the restoring force applied by membrane 604, such that membrane 604 collapses towards pull electrode 602. Membrane 604 is attracted to the different voltage, while the attraction force (i.e., the electric field) between membrane 604 and pull electrode 602 disappears at the instant that the voltage of membrane 604 becomes equal to the voltage of pull electrode 602. In other words, the attraction force between membrane 604 and pull electrode 602 with almost equal voltage will become smaller than the attraction force between membrane 604 and push electrode 606 which has a larger voltage difference, thereby causing membrane 604 to move towards push electrode 606.

Figure 7:
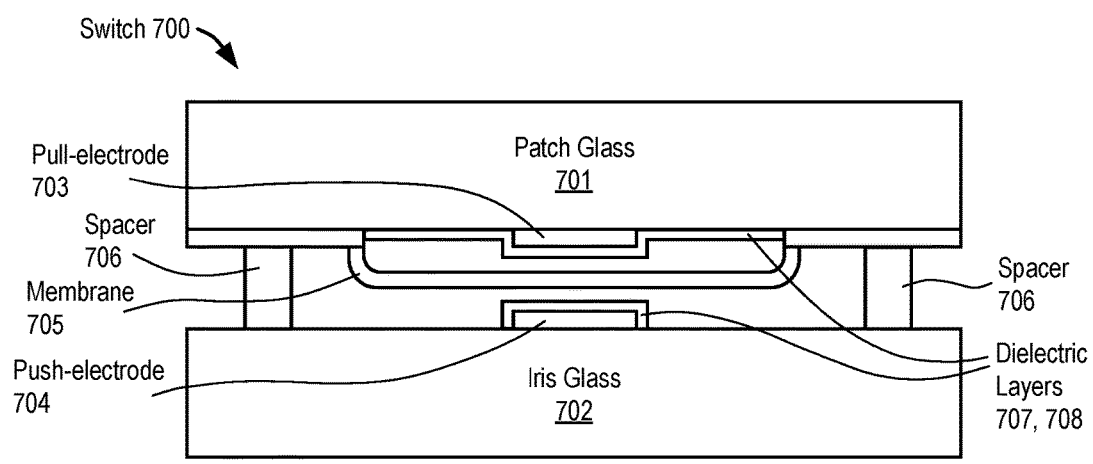
FIG. 7 is a cross-section schematic of one embodiment of a push-pull RF switch.

FIG. 7 is a cross-section schematic of one embodiment of a push-pull RF switch. Referring to FIG. 7, switch 700 includes patch substrate (e.g., glass) 701 and iris substrate (e.g., glass) 702. Pull electrode 703 is attached to patch substrate 701, while push electrode 704 is attached to iris substrate 702. Dielectric layers 707 and 708 cover pull electrode 703 and push electrode 704, respectively. Dielectric layer 707 is also attached to patch substrate 701. Membrane 705 is attached to patch substrate 701 and includes a centrally located portion that is positioned in the gap between patch substrate 701 and iris substrate 702. Spacers 706 are attached between patch substrate 701 and iris substrate 702 to maintain the size of the gap between them.

One embodiment of a fabrication process flow for fabricating push-pull MEMS switch 700 is given is described in more detail below.

A three-dimensional visualization of one embodiment of a push-pull MEMS switch is given in FIGS. 8A-C. FIG. 8A is a transparent image of the switch, FIG. 8B illustrates the switch from the patch side, and FIG. 8C illustrates the switch from the iris side. In one embodiment, to ease the removal of the sacrificial layer, the membrane can be perforated, as shown in FIG. 8A. The perforation eases the removal of the sacrificial layer and decreases the damping (e.g., viscos or squeeze film damping) during the operation of the tunable capacitor. The amount of perforation is determined in view of this and the desired capacitance change, i.e., tuning range.

In one embodiment, a single membrane is used in the RF resonator, as shown in FIGS. 6, 7 and 8A-8C. In another embodiment, multiple membranes are used. By using multiple membranes, different values of capacitance change can be created, thus more levels in tuning of the resonance frequency become available.

FIG. 9 illustrates one embodiment of a MEMS switch that includes multiple membranes. Referring to FIG. 9, switch 900 includes membranes 901 and 902. Using multiple moveable membranes provides a higher level of capacitance change.

Figure 10:
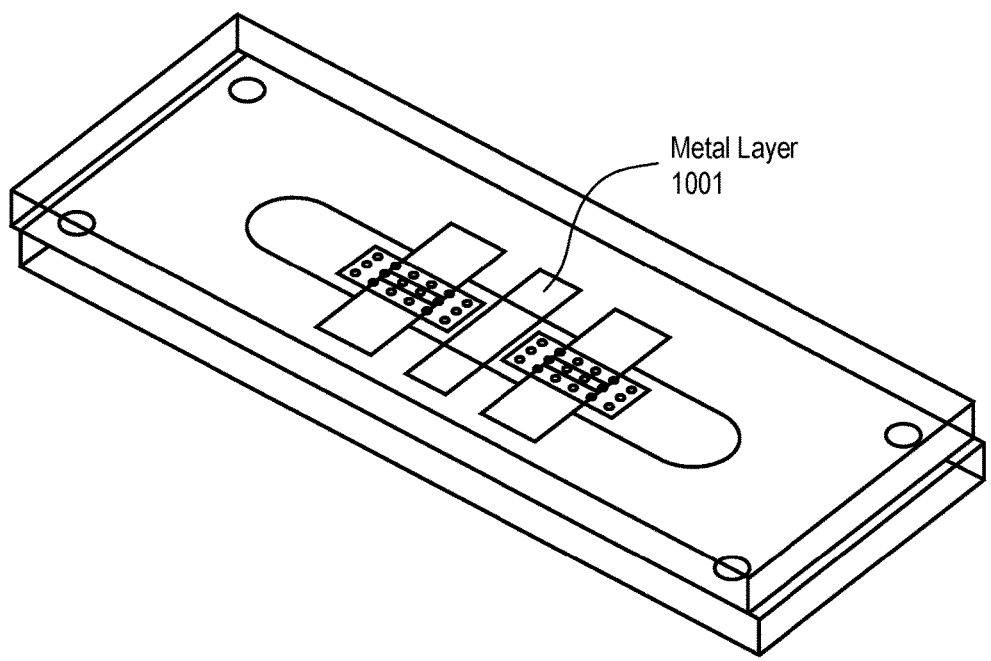
FIG. 10 illustrates an example of a MEMS switch using a fixed metal layer on the patch substrate.

Also, as shown in FIG. 9, the pull (patch) electrode attached to or formed on the patch substrate is extended over the push (iris) electrode attached to the iris substrate. By extending the patch electrode over the iris substrate, a fixed capacitance is created, if desired, which can be used in modifying the capacitance tuning range. FIG. 10 illustrates an example of a MEMS switch using a fixed metal layer on the patch substrate to introduce fixed capacitance in the circuit and to adjust the capacitance tuning range.

Alternatively, the fixed capacitance can be implemented by extending the patch metal layer over the iris opening. This is shown in FIG. 10. Referring to FIG. 10, a fixed metal layer 1001 of the patch layer on the patch substrate is used to introduce a fixed capacitance. In one embodiment, this extension is fixed to the patch substrate and is not moveable.

Figure 11:
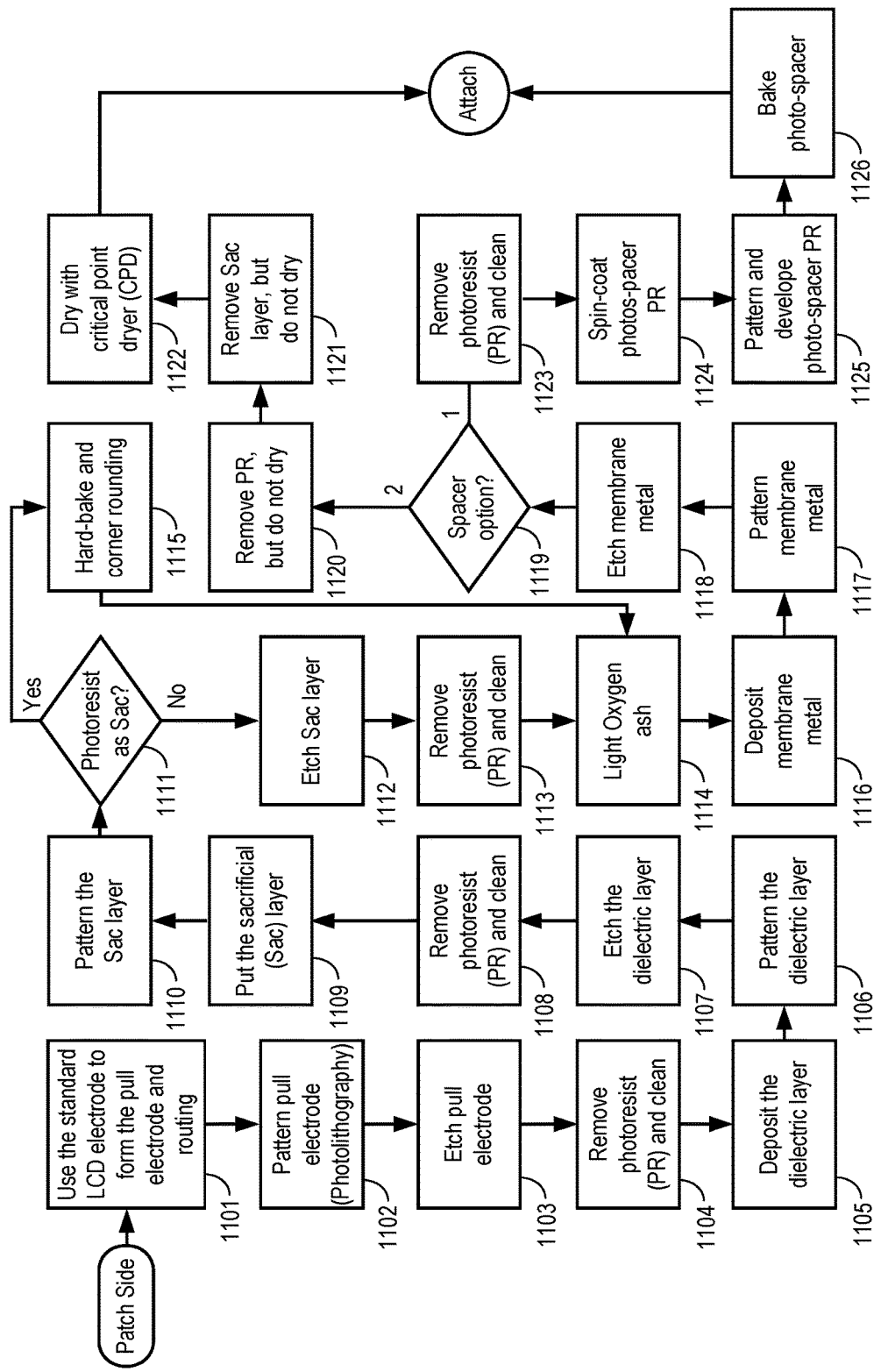
FIG. 11 is a flow diagram of one embodiment of a fabrication process for a push-pull RF MEMS switch.

FIG. 11 is a flow diagram of one embodiment of a fabrication process for a push-pull RF MEMS switch. As discussed below, the fabrication process is compatible with standard liquid crystal (LC) manufacturing processes.

The fabrication process results in one embodiment of a push-pull MEMS switch such as shown in FIG. 7. The switch is encapsulated between the iris and patch substrates (including thin-film transistors (TFTs) on the patch substrate using for addressing and controlling the MEMS tunable capacitors). In one embodiment, the substrates are glass. Alternatively, the substrates may comprise other materials that are RF transparent or in general have the desired RF transmission characteristic such as, for example, sapphire, silicon nitride, etc. There is a gap between the plates that is defined by spacers (e.g., photo-spacers). The membrane is pulled up and down by changing the voltage applied on it (variable bias). Thus, the capacitance between the iris and the membrane changes. In one embodiment, the electrodes are at constant voltages (e.g., 0V and 15V, or 0V and 5V, etc.). This is not required and in alternative embodiments, variable voltages are used. In one embodiment, the pull electrode on the patch glass substrate is at a constant high voltage, while the push the electrode on the iris glass substrate is at a constant low voltage. Dielectric layers (e.g., silicon nitride) over the electrodes prevent DC shorts when the membrane touches the electrodes.

In one embodiment, there are a number of fabrication considerations. For example, in one embodiment, the fabrication process does not damage the existing devices on the segment (e.g., TFT and circuitry on the patch glass) and is compatible with an LCD manufacturing process. In one embodiment, as described in more detail below, a sacrificial layer is used to define the pull-electrode gap (patch side) and is removable without damaging other components, while maintaining a high yield and reasonable throughput and cost, and is uniformly deposited. Note that, alternatively, the sacrificial layer may be used to define the push-electrode gap (iris side) if the membrane is formed on the iris side (as opposed to the patch side). In one embodiment, the sacrificial layer provides an efficient platform for successful deposition and patterning of the membrane layer. Also, with respect to alignment, the push electrode on the iris glass substrate needs to be aligned correctly with the membrane on the patch glass substrate.

In one embodiment of the fabrication process, the substrates include iris glass and patch glass (TFT). Some structural materials include copper, silicon nitride, signal lines (same as TFT metal lines), and photo-spacer (e.g., photoresist polymer, etc.). Sacrificial material options include a polymer (e.g., photoresist), dielectric layers (e.g., SiO$_2$, SiNx, etc.), metals (e.g., Al, Ti, etc.), and semiconductors (e.g., a-Si, poly-Si, etc.).

FIG. 11 illustrates one embodiment of a fabrication process to create the patch side of the MEMS switch. Referring to FIG. 11, the process begins by forming a pull electrode and routing on the patch substrate (process block 1101). This is performed using standard LCD metallization and routing fabrication techniques and results in creating a metal layer over the patch substrate. Next, the pattern is formed on the metal layer to the pattern the pull electrode (and routing) (process block 1102). In one embodiment, the patterning is performed using standard lithography. After patterning the pull electrode, the process etches the metal layer to create the pull electrode (process block 1103). After etching, any remaining photoresist (PR) from the non-etched areas is removed and the surface is cleaned (process block 1104).

After removing the photoresist and cleaning the surface, a dielectric layer is deposited over the surface (process block 1105). This is performed using standard deposition techniques. The dielectric layer is patterned (process block 1106) and etched (process block 1107). After etching the dielectric layer, the remaining photoresist is removed and the surface is cleaned (process block 1108).

After removing the photoresist and cleaning the surface, a sacrificial layer is deposited on the device (process block 1109) and patterned (process block 1110).

Depending on the whether a photoresist is used for the sacrificial layer, the fabrication process can proceed down two paths. If a photoresist is not used as a sacrificial layer (process block 1011), then the sacrificial layer is etched (process block 1112) and any remaining photoresist is removed and the surface is cleaned (process block 1113). Thereafter, the process transitions to processing block 1114. If a photoresist is used as a sacrificial layer, a hard bake and corner rounding operation is performed (process block 1115) and the process transitions to processing block 1114.

At process block 1114, a light oxygen ash operation is performed. Thereafter, a membrane layer is deposited (process block 1116). In one embodiment, the membrane is a metal layer. The membrane metal is patterned (process block 1117) and etched (process block 1118).

Next, depending on the spacer option chosen, the process can be completed in one of two ways. At process block 1119, if it is determined that option 1 for the spacer is chosen, the process transitions to process block 1123 where any remaining photoresist is removed and the surface is cleaned. Then a photoresist spacer is spin coated onto the surface (process block 1124), the photoresist is patterned and developed (process block 1125), and the photospacer is baked (process block 1126). At this point, the patch side is ready to be attached to the iris side.

If the photospacer option 2 is selected, the photoresist is removed, but the surface is not dried (process block 1120), the sacrificial layer is removed but the surface is not dried (process block 1121), and then the surface is dried with a critical point dryer (CPD) (process block 1122). At this point, the patch side is ready for attachment to the iris side.

FIGS. 12A-K illustrate the steps in the fabrication process in more detail.

Figure 12A:
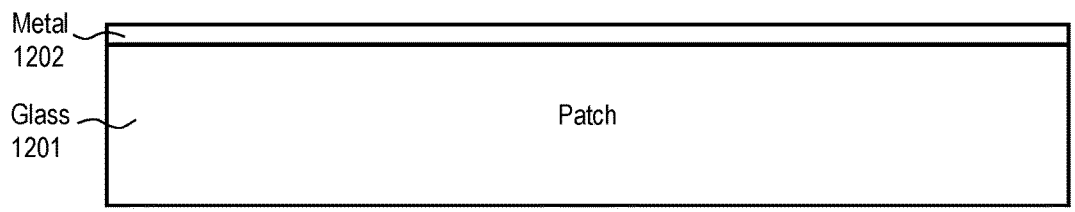
FIGS. 12A-K illustrate the steps in the fabrication process in more detail.

FIG. 12A illustrates the patch metallization process. Referring to FIG. 12, metal layer 1202 is deposited on patch glass 1201. In one embodiment, where the patch glass 1201 has drive circuits, such as TFTs, the processing on the patch glass is performed to have minimal effect on TFT's on patch glass 1201. In one embodiment, metal layer 1202 on patch glass 1201 is for forming the pull electrode. In one embodiment, metal layer 1202 comprises CMOS compatible metals, such as, for example, Al/Cu, Al, Cu, etc. Note that an adhesion promotor layer (e.g., Cr, Ti, etc.) may be used.

Metal layer 1202 may be deposited using a PVD deposition technique, such as DC sputtering. Note that the metal thickness may be based on the RF requirements for skin depth, loss, etc.

Note that in one embodiment, the metal line can serve as an actuation line at DC and as a part of the resonator at RF.

Figure 12B:
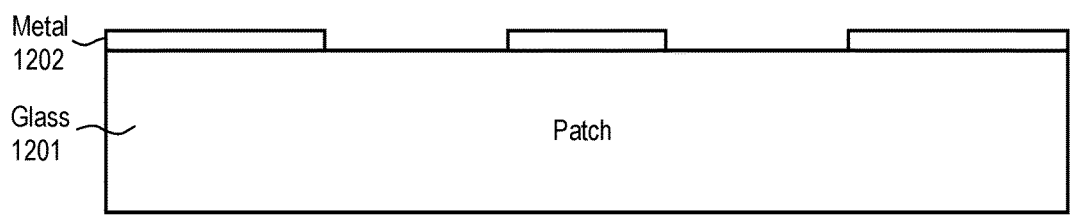

After performing metallization, the fabrication process creates the metal lines. In one embodiment, these metal lines are used for pull electrode and for connecting to the membrane. FIG. 12B illustrates creation of the metal lines from metal layer 1202. In one embodiment, the metal lines are created using a standard lithography process, such as for example, a proximity technique, with step & repeat. An etch process may be used to remove portions of metal layer 1202. The type of etch process may depend on the acceptable amount of undercut (RF requirement). Wet etch typically results in a large undercut, but with high throughput and low cost, while a dry etch results in small undercut, can be time consuming, and higher cost. In one embodiment, the process of metal line creation includes a standard photoresist removal and clean step (e.g., photoresist (PR) remover followed by SC1 (Standard Clean Solution #1) and spin rinse dryer (SRD)).

Figure 12C:
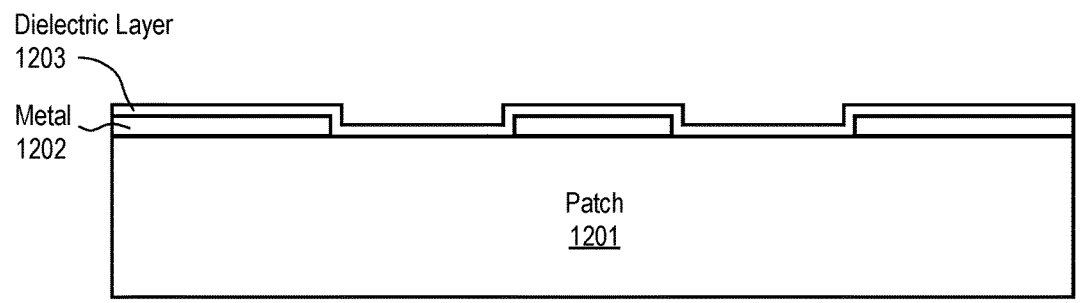

After creating the metal lines, a dielectric layer is deposited. FIG. 12C illustrates the dielectric deposition. Referring to FIG. 12C, a dielectric layer 1203 is deposited on top of the remaining parts of metal layer 1202 and the parts of patch glass 1201 that were left exposed after the lithography process that created the metal lines. In one embodiment, dielectric layer 1203 provides an insulation in DC and adjusts capacitance tuning range in RF. In one embodiment, the thickness of dielectric layer 1203 is 100 nm. The thickness could be defined by RF. In one embodiment, the thickness of metallization on patch side does not have a significant impact on RF, and it is defined by the requirement from other functions on the patch, for example, TFT circuitry. In one embodiment, dielectric layer 1203 requires break down voltage as high as 50V.

A number of well-known deposition techniques may be used to deposit dielectric layer 1203 including, but not limited to, PECVD, RF sputtering, etc.

Figure 12D:
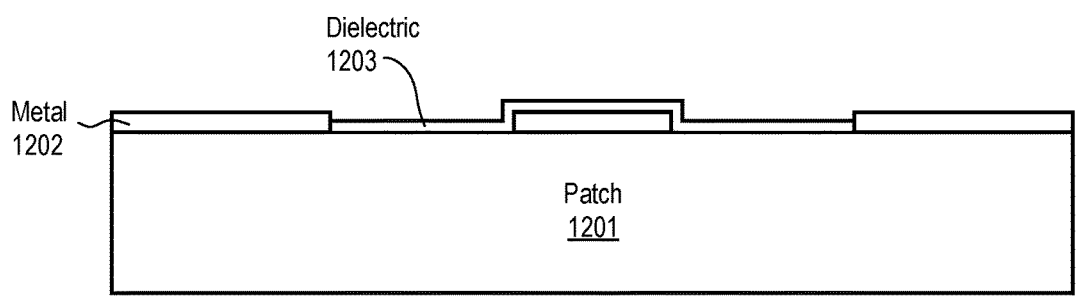

After depositing the dielectric layer, portions of the dielectric layer are removed. FIG. 12D illustrates the results of removing portions of dielectric layer 1203 that was deposited in FIG. 12C. In one embodiment, portions of the dielectric layer are removed using a standard lithography process, such as for example, a proximity technique, with step & repeat. In the process, the photoresist is deposited and then portions of the photoresist and the portion of the dielectric layer beneath those portions of the photoresist are removed via etching. In one embodiment, a dry etch process may be used for SiNx removal, for example. Alternatively, a dry or wet etch process may be used for $SiO_2$ removal, for example. In one embodiment, following the etch step, the process of dielectric layer removal includes a standard photoresist removal and clean step (e.g., photoresist (PR) remover followed by SC1 (Standard Clean Solution #1) and spin rinse dryer (SRD)).

Figure 12E:
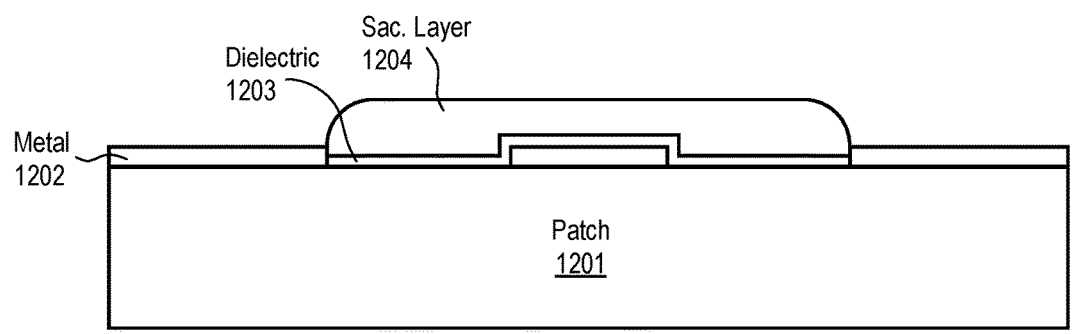

After dielectric layer removal, the fabrication process deposits a sacrificial layer onto the remaining portions of the dielectric layer. FIG. 12E illustrates the results of deposition sacrificial layer 1204 onto the remaining portions of dielectric layer 1203. In one embodiment, the deposition of sacrificial layer does not affect the underlying layers.

In one embodiment, sacrificial layer 1204 is deposited using standard deposition and etching techniques. The deposition and etching may depend on the choice of material for sacrificial layer 1204. As part of the deposition process, lithography may be used. In such a case, a photoresist such as, for example, SC1813, is used and is deposited with a thickness of 0.5 to 10 um. Note that with the reflow process for the SC1813 photoresist, the corners of the photoresist layer can be rounded. This helps forming conformal supports for the membrane metal layer. Note also that in one embodiment, using SC1813 could facilitate use of Option 2 in creating photo-spacers as described in further detail below. In alternative embodiments, sacrificial layer 1204 comprises a metal (e.g., Al, Ta), dielectrics (e.g., SiO2), or a polymer in general (not specifically photoresist).

Figure 12F:
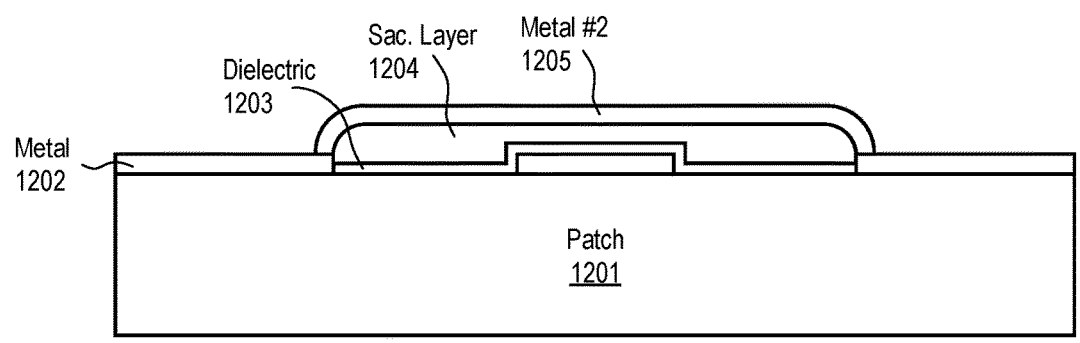

After depositing the sacrificial layer, the process deposits a membrane over the sacrificial layer. In one embodiment, the membrane is metal. In alternative embodiments, the membrane may be other conductive material such as, for example, semiconductors (e.g., poly-crystal silicon, etc.). FIG. 12F illustrates the membrane metal deposited onto the sacrificial layer. Referring to FIG. 12F, membrane metal 1205 is deposited onto sacrificial layer 1204. In one embodiment, the metal comprises copper. In other embodiments, the metal comprises aluminum, gold, silver, etc. In one embodiment, the thickness of the membrane metal is 500 nm. In one embodiment, to improve the electrical and mechanical connectivity, the residues from the surface are removed via plasma-ashing prior to the metal deposition.

In one embodiment, the deposition of membrane metal 1205 has a minimal effect on the quality of the sacrificial layer removal, is conformal, and supports the RF thickness requirements. In one embodiment, in order to improve the adhesion of the metal membrane, an adhesion promoter layer could be used between metal 1205 and sacrificial layer 1204. In one embodiment, the adhesion promoter layer comprises Ti or Cr, but others may be used.

In one embodiment, the deposition is performed by direct current (DC) sputtering. DC sputtering should not be used or should be optimized if it changes the quality of the sacrificial layer, for example by overheating the sample. To avoid overheating the sacrificial layer, the DC sputtering can be performed in multiple steps without breaking the sputterer vacuum.

Figure 12G:
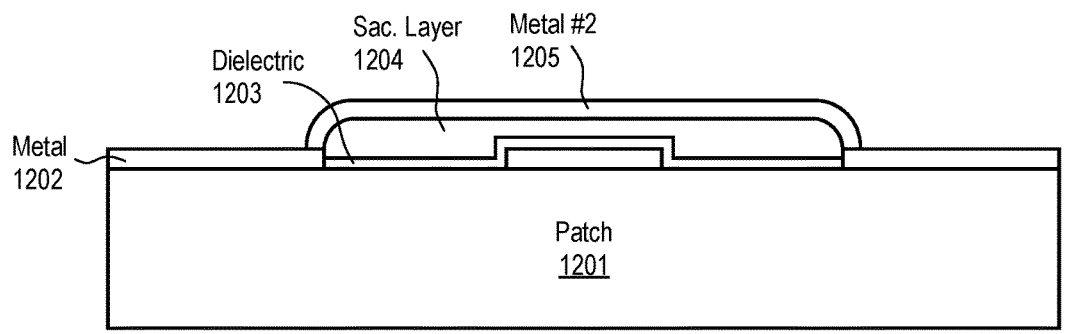

After depositing the membrane metal, the membrane is patterned. FIG. 12G illustrates the results of patterning the membrane. In one embodiment, the patterning process includes performing photolithography, etch and photoresist removal (and cleaning). It is advantageous if these operations do not negatively affect the sacrificial layer or the underlying layer including TFTs or other drive circuitry that may be on the patch substrate.

After patterning the membrane, spacers are fabricated on the device. In one embodiment, the spacers comprise photo-spacers. The spacers are needed to provide a control gap between the electrodes and to avoid damaging the MEMs structure between the iris and the patch glass substrates.

There are a number of options for creating spacers, such as a photospacer. In one embodiment, the options depend on the glass on which the photo-spacers are fabricated. In such a case, there may be at least two options. In the first option, the photo-spacers are fabricated on the patched glass side. This allows for good alignment with TFT or other drive circuitry and the membrane. However, in one embodiment, the sacrificial layer is removed after patterning the photo-spacer (otherwise the released membrane can be damaged) and removing the sacrificial layer can damage the photo-spacers (which means there will be significant limitation using the photoresist as the sacrificial layer). Another option is to fabricate the photospacer on the iris glass side. This is advantageous in that the step for the sacrificial layer removal will be independent from the step for photospacer placement. The sacrificial layer can be removed either before or after attaching the iris and patch glasses. Note that this is also advantageous because it is possible to use the photoresist for the sacrificial layer in this option. Even so, placing the photo-spacers on the iris glass affects alignment in that it makes it more difficult to align the electrodes on the patch and iris glasses.

Each of these options will be discussed separately below.

Figure 12H:
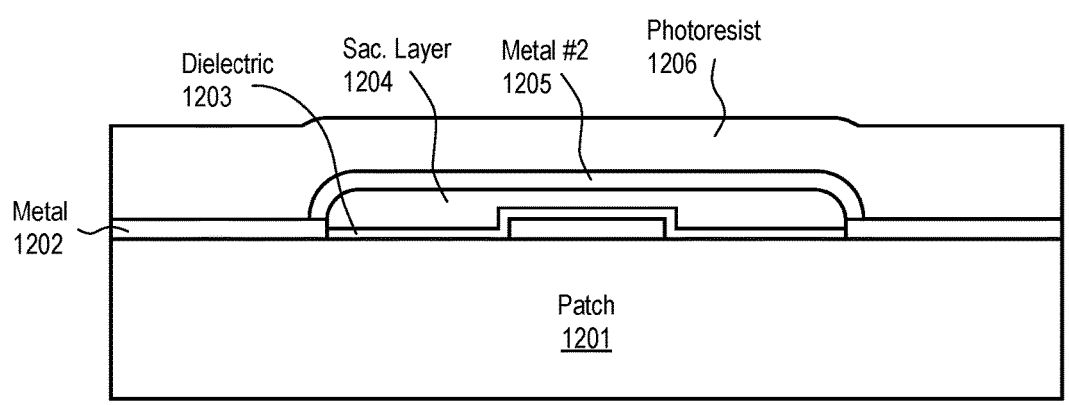

For option 1, the fabrication of the photo-spacers begins by performing a photospacer coating operation in which a photoresist is deposited onto the surface. FIG. 12H illustrates the result of depositing a photoresist over the patch glass. Referring to FIG. 12H, photoresist 1206 is deposited over the surface. In one embodiment, photoresist 1206 is spun over the patch glass. In one embodiment, the thickness of photoresist 1206 on non-active (away from the membrane) defines the gap between the push electrode (on the iris) and the surface of the membrane.

After performing the photospacer coating, the photospacer is patterned. In one embodiment, the photoresist is patterned using a conventional photolithography process. Exposure, developing and baking of the photoresist should be performed in a way so as not to have a negative impact on the sacrificial layer. Because the thickness of the photoresist at distances away from the membrane is uniform, there is no need for CMP or lap polishing.

Figure 12I:
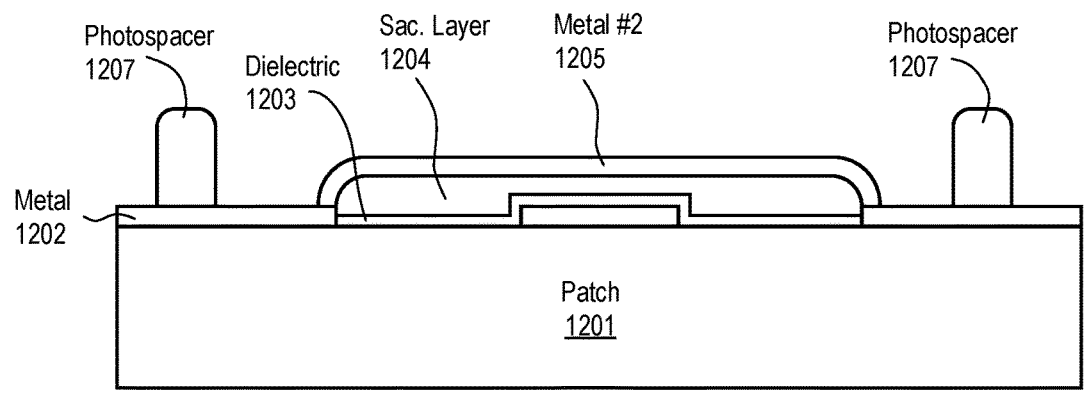

FIG. 12I illustrates results of performing photospacer patterning. Referring to FIG. 12I, photo-spacers 1207 remain on the surface after photospacer patterning of the photoresist layer.

After photospacer patterning, a membrane release process operation is performed. The membrane release processing operation removes the sacrificial layer. In one embodiment, the sacrificial layer remover that is used to remove the sacrificial layer is chosen so that it does not negatively impact the structural layers, the TFTs or other drive circuitry on the glass substrate, as well as the spacers.

Note that there are number of risks in removing the sacrificial layer such as (1) stiction of the membrane to the bottom surface (e.g., the patch electrode) and (2) blowing away the released membranes during the rinse and dry (SRD) and handling process before the next process operation. These risks may be mitigated by using critical point dry (CPD) or Marangoni dry of the segment to avoid stiction. Some risk may be mitigated by using the opposite (e.g., push) electrode (on the iris side) to pull the stuck membrane to the suspended position in the finished device.

Figure 12J:
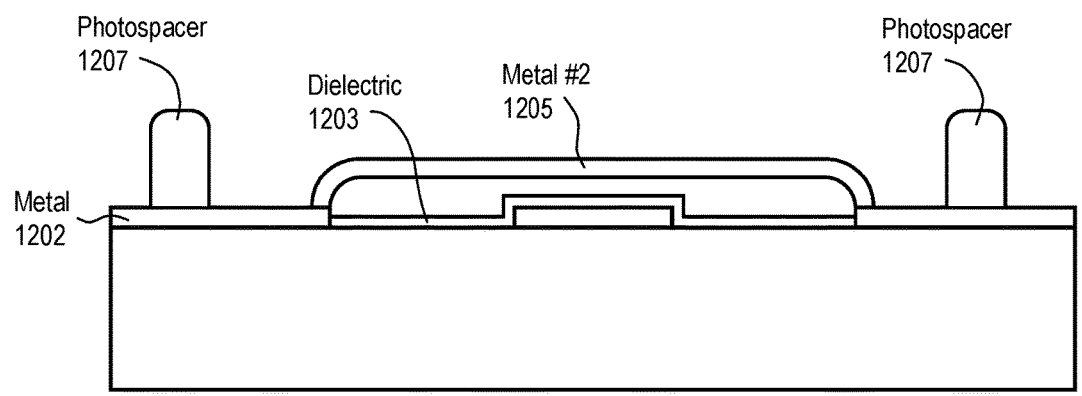

FIG. 12J illustrates the device after the membrane release operation. Referring to FIG. 12J, the sacrificial layer beneath membrane metal 1205 has been removed, thereby leaving the membrane.

Figure 12K:
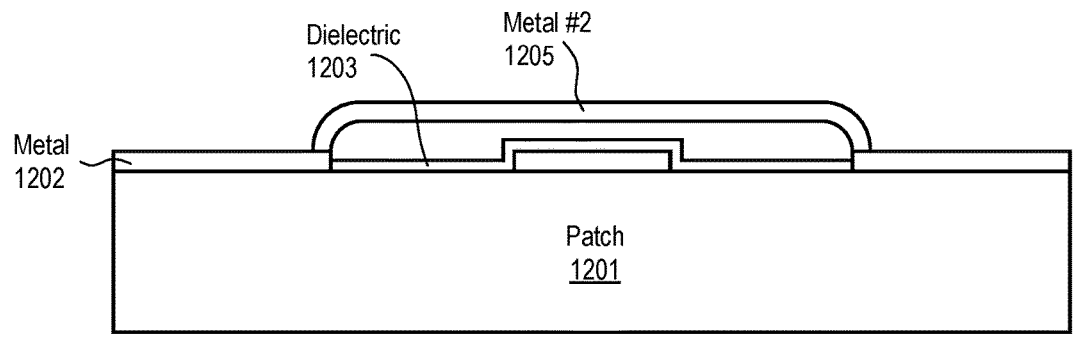

For photospacer option 2, in which the photo-spacers are deposited on the iris glass, the fabrication process changes. In this case, directly after patterning the metal membrane on the patch glass side, the sacrificial layer is removed. FIG. 12K illustrates the example of option 2 for the patch glass side after the sacrificial layer has been removed. Note that the same risks involved in sacrificial layer removal as described above with option 1.

There are a number of advantages with using option 2 with respect to option 1. First, there are no constraints in the etching selectivity between the sacrificial removal and the photo-spacers. This means the sacrificial layer can be a photoresist. Also, option 2 provides better uniformity of the photospacer layer since the photoresist is spun over the iris glass with a smaller typography change. There is at least one disadvantage with respect to using option number 2 in comparison to option number 1 in that the handling of iris glass and the alignment is different. Note that if a similar type of photoresist is used for the sacrificial layer, when patterning the membrane, the sacrificial layer removal step can be combined with the membrane and photoresist removal step.

Figure 13:
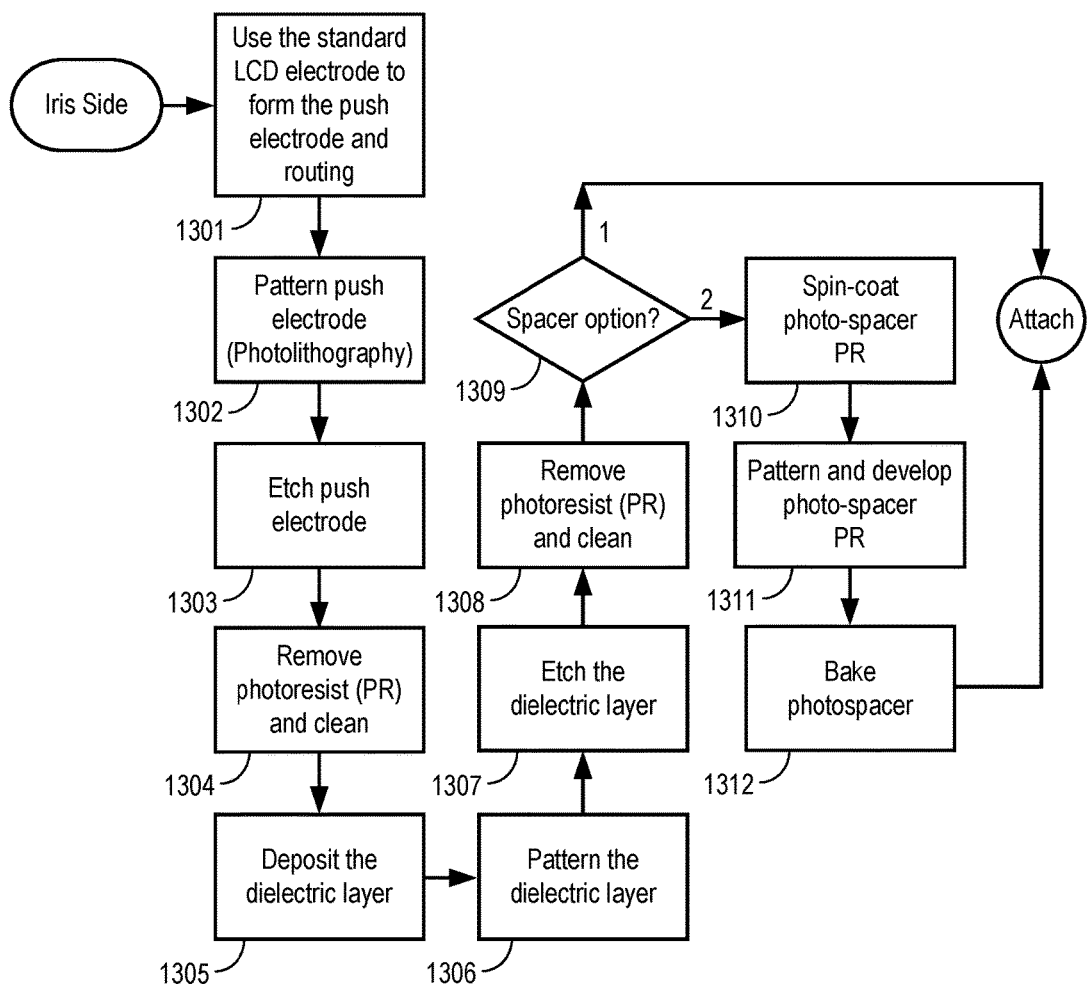
FIG. 13 illustrates one embodiment of a fabrication process for the iris side of the switch.

FIG. 13 illustrates one embodiment of a fabrication process for the iris side of the switch. Referring to FIG. 13, the process begins by forming the push electrode and routing (process block 1301). In one embodiment, standard LCD metallization process and routing fabrication techniques are used to form the push electrode and routing. Next, the push electrode is patterned (process block 1302). In one embodiment, the patterning of the push electrode is performed using the standard photolithography techniques. Thereafter, the push electrode is etched (process block 1303) and the photoresist removal and surface cleaning step is performed (process block 1304).

After the photoresist surface has been cleaned, a dielectric layer is deposited over the iris (process block 1305) and patterned (process block 1306). After patterning the dielectric layer, the dielectric layer is etched (process block 1307) and the photoresist that remains after etching is removed and the surface cleaned (process block 1308). Thereafter, photo-spacers may or may not be deposited on the iris side depending on which option (1309) is selected. If no photo-spacers are deposited (option 1), the iris side is ready for attachment to the patch side. If the photo-spacers are to be deposited on the iris side (option 2), then the process includes depositing the photospacer photoresist onto the iris side (process block 1310). In one embodiment, the photo-spacer photoresist may be spin coated onto the iris side. Thereafter, the photoresist is patterned and developed (process block 1311) and then baked (process block 1312). At this point, the iris side is ready for attachment to the patch side.

Figure 14A:
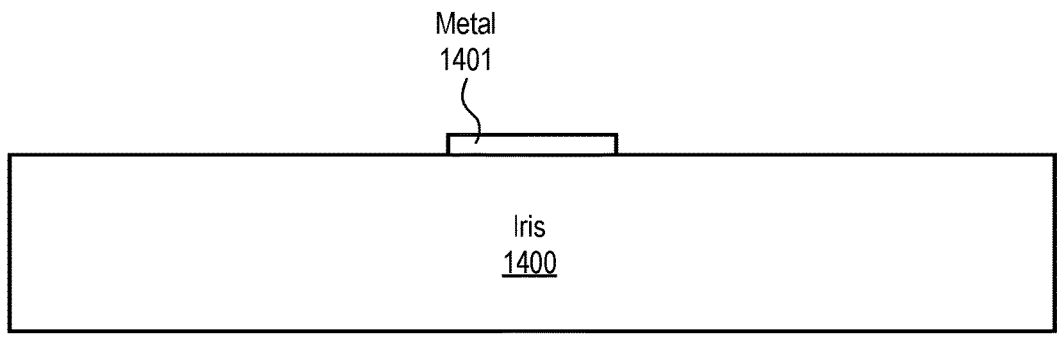
FIGS. 14A-14D illustrate the fabrication process of the iris side.

FIGS. 14A-14D illustrate the fabrication process of the iris side. As discussed above, the fabrication process for the iris starts with metallization patterning. FIG. 14A illustrates results of performing the metallization and pattern process on the iris side. In this case the metal layer 1401 is deposited across the iris 1400. In one embodiment, the metallization and patterning process is performed using standard lithography and wet etch processing. Subsequently, the metal layer is patterned and etched to create the push electrode and routing.

In one embodiment, there is no TFT or other drive circuitry on the iris glass, there are less constraints to the processing process. In one embodiment, the metal layer on the iris is the same level used for the LCD electrodes. In one embodiment, metal layer 1401 comprises copper. Other materials may be used for metal layer 1401 such as, for example, Al, Au, Ag etc. In one embodiment, the metal thickness is defined by the RF requirements. For example, in one embodiment, the metal thickness is 2 microns. In one embodiment, an adhesion promoted layer (e.g., Cr, Ti, etc.) may be used to increase adhesion of the metal layer to the iris glass substrate.

After creating the electrode, the fabrication process deposits a dielectric layer on the electrode. Similar to the patch side fabrication, the function of dielectric layer is to provide insulation between the moveable membrane and the iris electrode when they come in contact. To provide a smaller pull-in voltage, the thickness of dielectric layer can be larger than that of dielectric layer on the patch side.

Figure 14B:
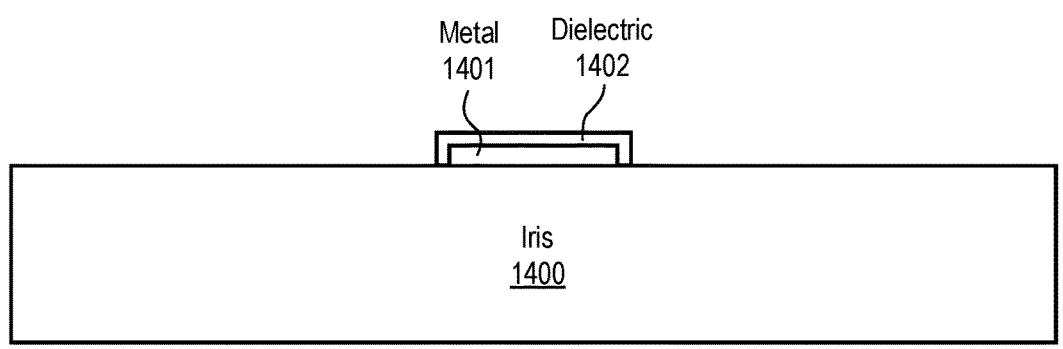

In one embodiment, the dielectric layer is fabricated using standard photolithography and etch similar to that used for patch dielectric layer deposition. For example, in one embodiment, PECVD is used to deposit a layer of low stress SiNx. FIG. 14B illustrates results of depositing and etching the dielectric layer over the electrode on the iris side.

Note with respect to option 1 for creating the photo-spacers, the iris glass is ready to be attached to the patch glass at this stage, while for option 2 for photo-spacer, a photoresist needs to be spun and patterned on the iris glass, as discussed below.

Figure 14C:
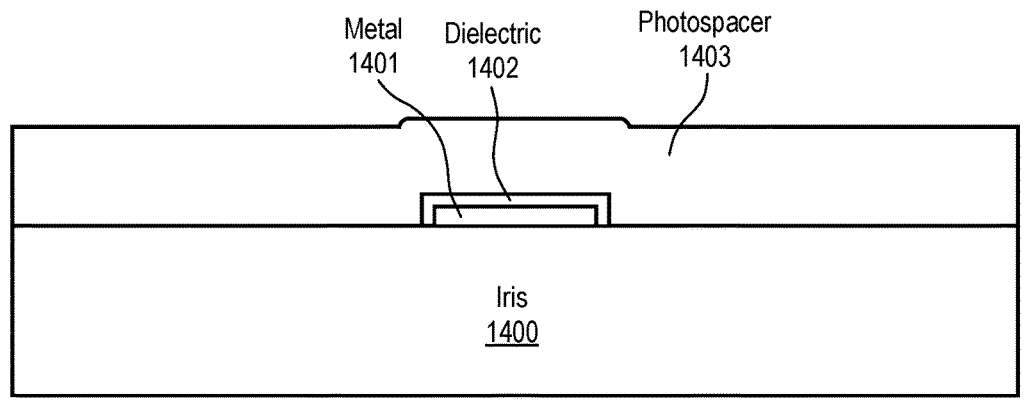
Figure 14D:
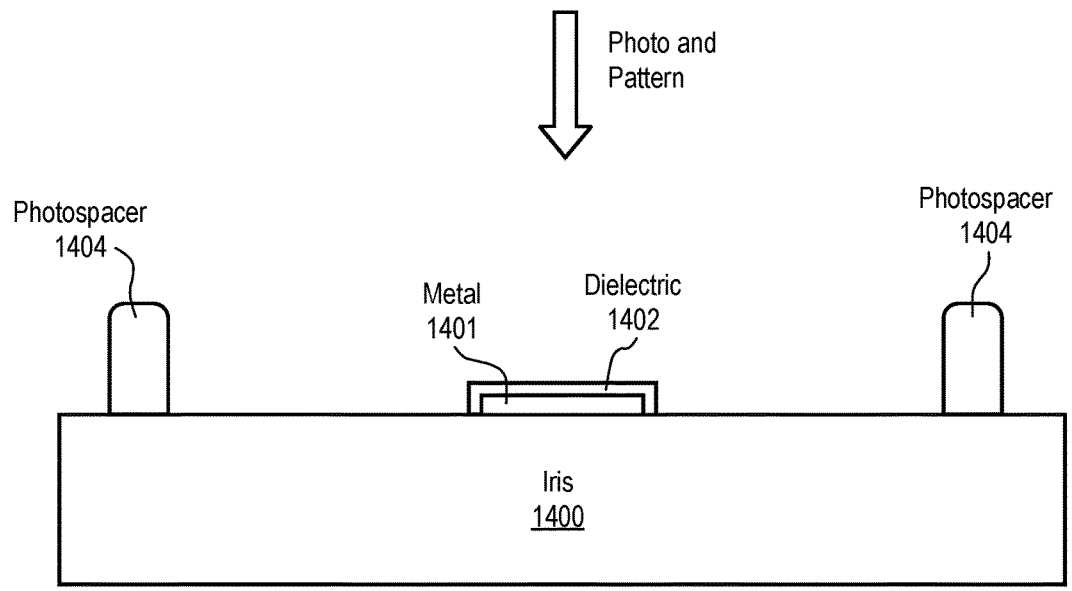

In one embodiment, to fabricate the photo-spacers on the iris glass, standard spin-coat and patterning of the spacers are used. Since there is no sacrificial layer on the iris glass, there will be no constraint on extra baking and hardening of photo-spacers, except the material property of the photoresist itself. FIGS. 14C and 14D illustrates the iris side fabrication, including depositing a photoresist onto the iris side and then patterning, etching and cleaning it to create photo-spacers 1404.

Figure 15:
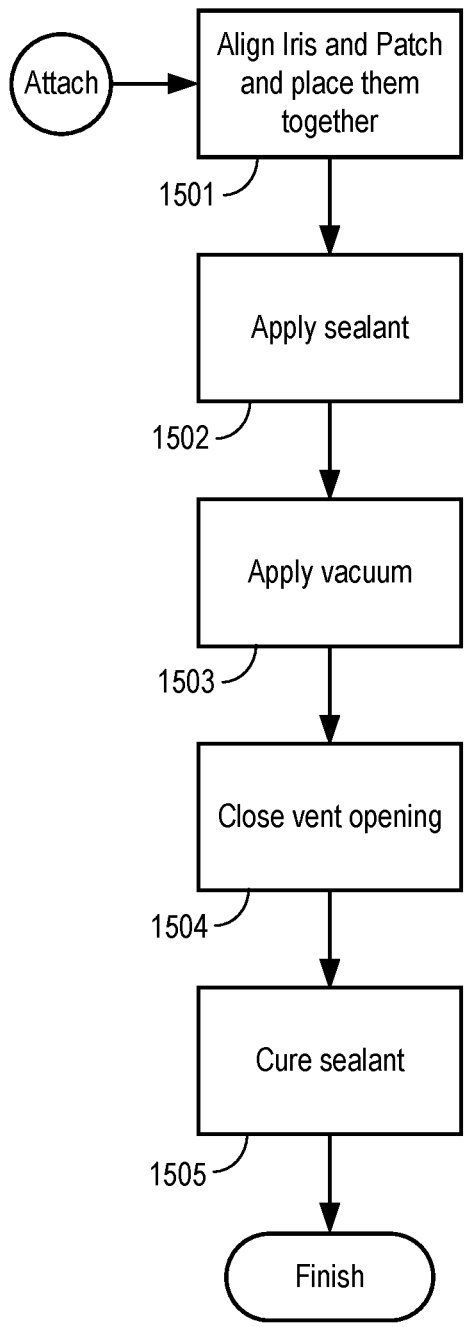
FIG. 15 is a flow diagram of one embodiment of a fabrication process to attach the iris and patch glass segments together.
Figure 16:
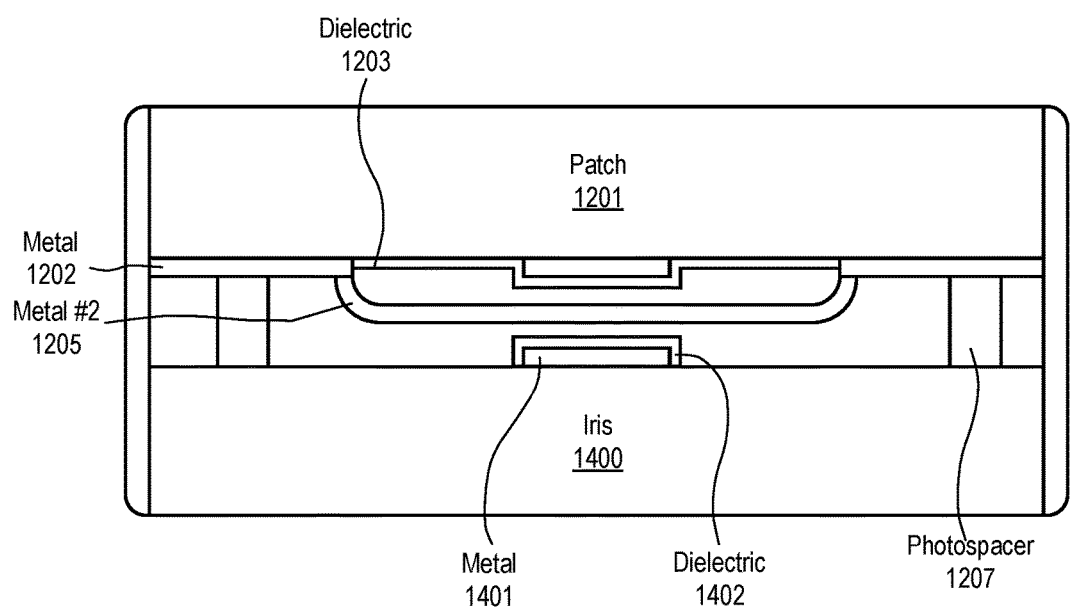
FIG. 16 illustrates an example of the iris and patch glass segments attached to each other.

After the patch glass segment and iris glass segment have been fabricated, they are attached to each other. In one embodiment, the two glass segments (iris and patch) are attached together using the standard processes utilized in the LCD manufacturing. FIG. 15 is a flow diagram of one embodiment of a fabrication process to attach the iris and patch glass segments together. Referring to FIG. 15, the process begins by aligning the iris and patch segments and placing the together (process block 1501). The alignment is performed to align the push and pull electrodes with each other, so that one is beneath the other. Next, sealant is applied on the edge of glass stack (process block 1502) and the glass segments are attached, preferably, in a vacuum (process block 1503). The vacuum increases the break-down voltage and decreases the squeeze film dampening, which can lead to further decrease in the switching time. The vacuum also does not let the sealed segment bulge in low pressures. Once in the vacuum, the vent opening is closed (process block 1504) and the sealant is cured (process block 1505). Thereafter, the iris and patch glass segments are attached. FIG. 16 illustrates an example of the iris and patch glass segments attached to each other.

Another Embodiment of a MEMS-Based RF Resonator

In an alternative embodiment, another RF tunable resonator is used in a metamaterial holographic antenna. In such a resonator, the capacitance or inductance is also adjusted through the use of microelectromechanical systems (MEMS). However, in this embodiment, the adjustment is performed using an anchoring mass and spring actuator that can push or pull the patch in various ways to change the capacitance or inductance of the resonator. In one embodiment, the actuator is a MEMS device that operates like a "zipper" actuator developed by Qualcom Pixtronix, which is well-known in the art. That is, the capacitive or inductive tuning of metamaterial antenna elements is implemented with a "zipper" actuator. Other actuators may be used such as, for example, but not limited to, comb drive, parallel plate and thermal actuators. In one embodiment, the adjustments are permanent once they have been made. In another embodiment, adjustments may be made dynamically such that an antenna can be configured for use with a resonator adjusted into two different configurations at two different times.

As with the resonator disclosed above, in one embodiment, this resonator is implemented with a patch/iris pair that performs the necessary tuning required to produce the holographic beam forming effect, while increasing tunability and radiation efficiency versus using liquid crystal. Specifically, an RF resonator comprises a tunable slot where the tuning element is located above the slot and is moved laterally with a MEMS actuator to tune the slot. The patch element can be physically displaced to change the capacitance or inductance of the resonator. This allows for a much larger tunability and permits design trade-offs that increase radiation efficiency relative to using liquid crystals (LCs) or other techniques in the art.

By implementing a holographic metamaterial antenna using elements switched with a MEMS "zipper" actuator, the frequency band can be changed between two bands, e.g., from Ku to Ka, for more frequency agility than is currently capable with LC tuning. Thus, the switching may occur dynamically.

For purposes herein, the aperture layer is synonymous with the iris and the micro-shutter is synonymous with the patch.

Figure 17:
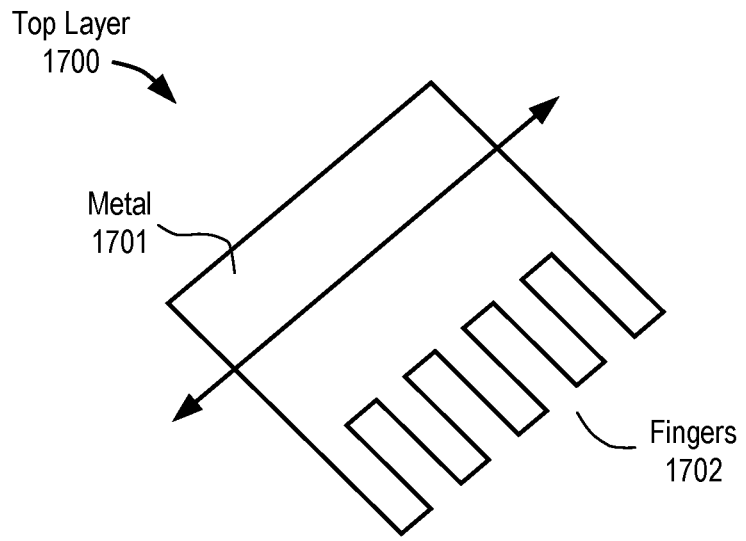
FIGS. 17 and 18 illustrate top and bottom layers, respectively, of the interdigital capacitor.
Figure 18:
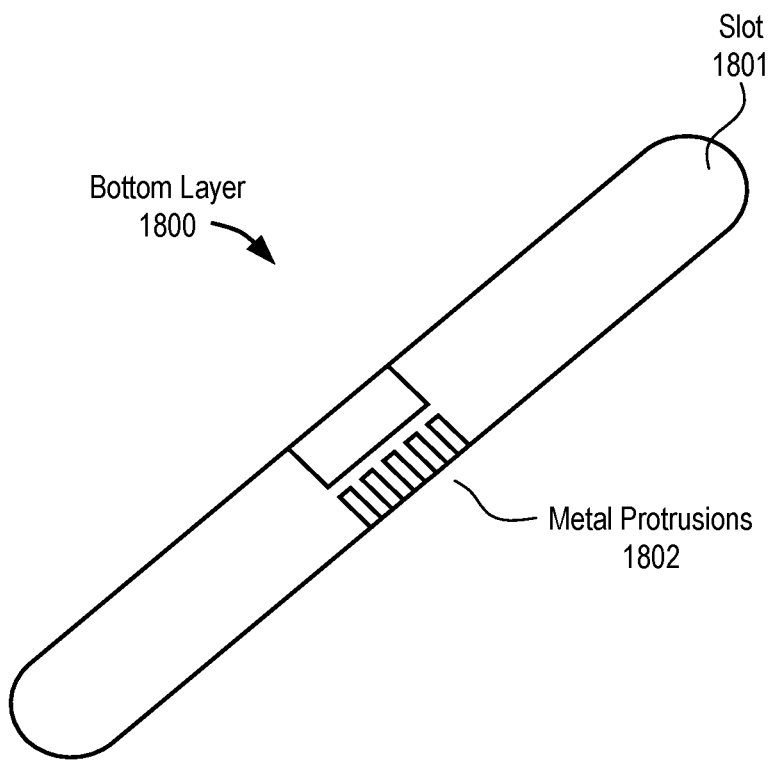

In one embodiment, the MEMS-tuned RF resonator is an interdigital capacitor (IDC). FIGS. 17 and 18 illustrate top and bottom layers, respectively, of the interdigital capacitor. Referring to FIG. 18, bottom layer 1800 contains iris slot 1801 with metal protrusions 1802 at the center of slot 1801. Bottom layer 1800 with metal protrusions 1802 may comprise, for example, copper, aluminum, silver, gold, etc. While the preference is to locate metal protrusions 1802 at the center of slot 1801 as this gives the maximum tuning, this is not required. The placement of metal protrusions 1802 impacts the device function. In one embodiment, metal protrusions 1802 are placed at a minimum in the RF current density to reduce, and potentially minimize, conductive losses. Referring to FIG. 17, top layer 1700 contains the patch, where the patch is displaced vertically from the plane of slot 1801 by a gap distance. In one embodiment, this gap is of a typical dimension as the LC-based antenna (e.g., 3-10 microns). The patch contains metal fingers 1702. The spacing between fingers 1702 and the number of fingers may be varied. In one embodiment, the spacing depends on the traveling range and alignment accuracy. In one embodiment, as an example, the spacing may be 0.5 to 10 um. In one embodiment, the number of fingers can be 1 to, e.g., 50. Also, fingers 1702 do not have to be all the same size. However, the number, length, width and height from bottom layer 1800 all impact the total capacitance that can be obtained. Furthermore, while fingers 1702 are shown with squared ends, this is not required either. Fingers having ends with other shapes may be used. For example, rounded edges may be used. Also, the ends of the fingers need not all have the same shape. Note that the same can be said for the corresponding metal protrusions 1802 in the bottom layer.

Note also that fingers 1702 and protrusions 1802 may be made of conductive materials other than metals, such as, for example, highly doped poly-silicon, amorphous silicon, or conductive polymers or semi-conductive materials, such as, for example, conductive polymers, conductive ceramics, e.g., ITO, zinc oxide, etc.

Figure 19:
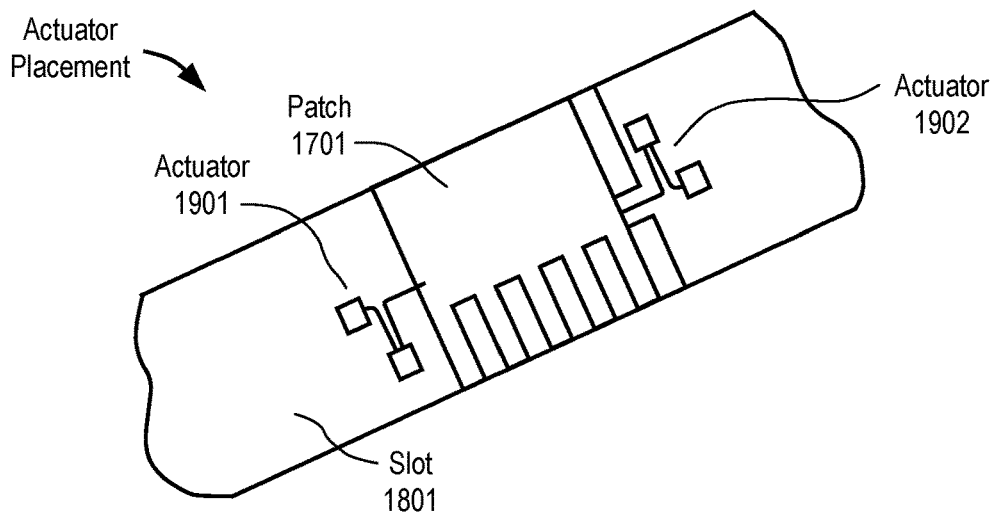
FIG. 19 illustrates a combined view of both the top and bottom layers of an interdigital capacitor.

FIG. 19 illustrates a combined view of both the top and bottom layers, with the placement of the MEMS actuator, which includes actuator portions 1901 and 1902. In one embodiment, the MEMS actuator is fabricated on the patch (top) substrate and is attached to both sides of the patch metal structure. The actuator may be a separate thermal or electrostatic actuator, such as, for example, a comb drive or zipper. As shown in FIG. 19, the RF resonator has no overlap between the IDC layers. Note that coupling the actuator at the center of the patch is advantageous.

Figure 20A:
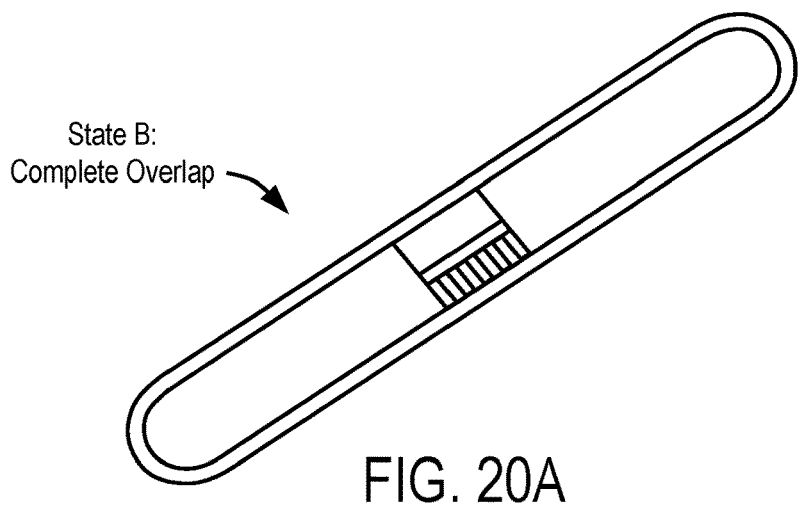
FIGS. 20A and 20B show two MEMS-tuned resonators, one with no overlap and minimum capacitance and one with maximum capacitance, respectively.
Figure 20B:
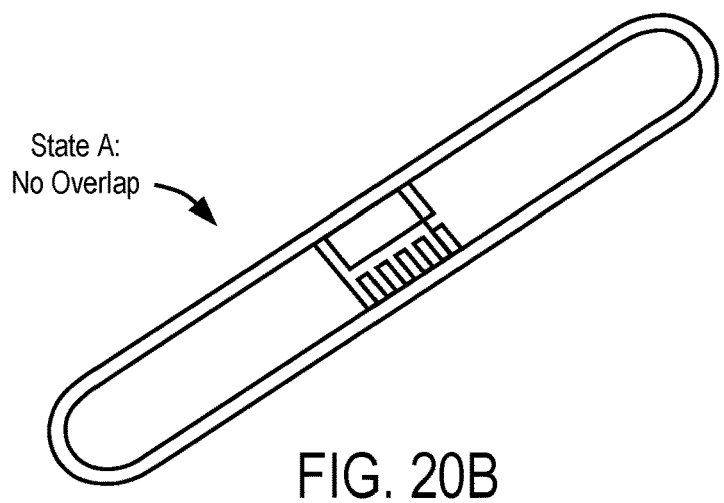

FIGS. 20A and 20B show two MEMS-tuned resonators, one with no overlap and minimum capacitance (state A: no overlap) and one with maximum capacitance (state B: complete overlap), respectively. The width of the fingers and gaps corresponds to the maximum lateral displacement of the MEMS actuator. That is, to change the capacitance, the traveling distance produced by the MEMS actuator must create a variation in in the overlap between the fingers. In one embodiment, the width of the fingers and gaps between fingers is 50 microns. In another embodiment, the fingers and gaps are 100 microns wide.

During operation, the position of the patch can be tuned to intermediate states between state A and state B, with a continuously variable capacitance. The intermediate states may be used when gray shading is desired.

Figure 21:
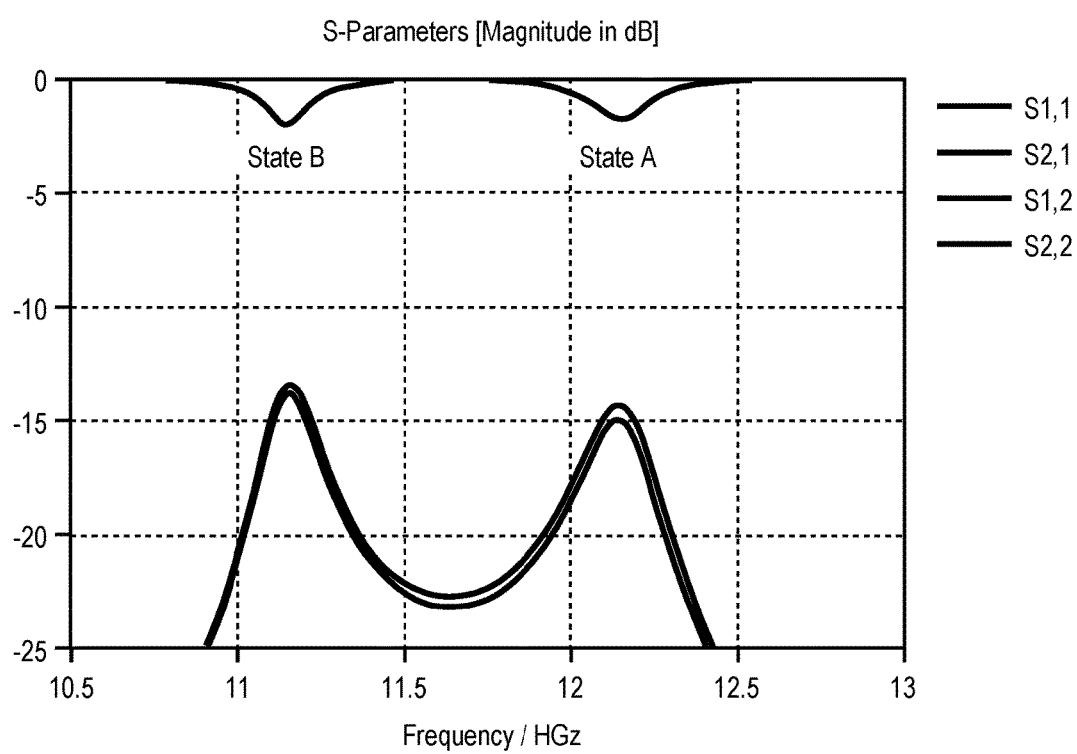
FIG. 21 shows the insertion loss of a two-element simulation where one element is in an overlap state A and the other is in a non-overlap state.

FIG. 21 shows the insertion loss of a two-element simulation where one element is in state A and the other is in state B. The resonant frequencies of the two elements are shown in the plot, where the resonator in state B has a resonance frequency of 11.2 GHz, and the resonator in state A has a resonance frequency of 12.2 GHz.

Figure 22:
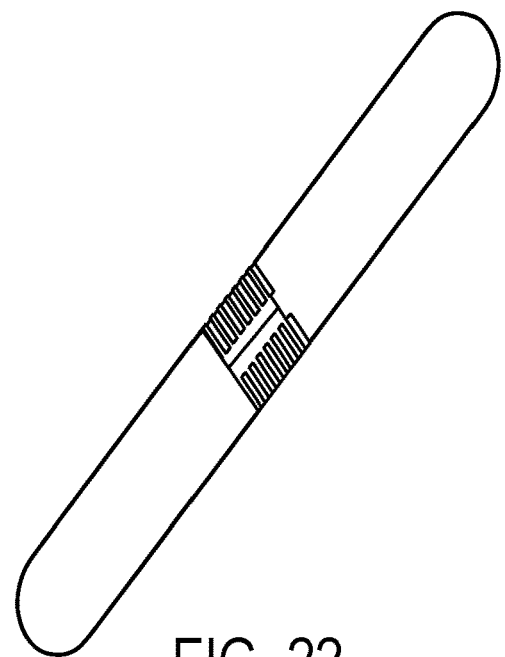
FIGS. 22 and 23 illustrate an example of a double IDC.
Figure 23:
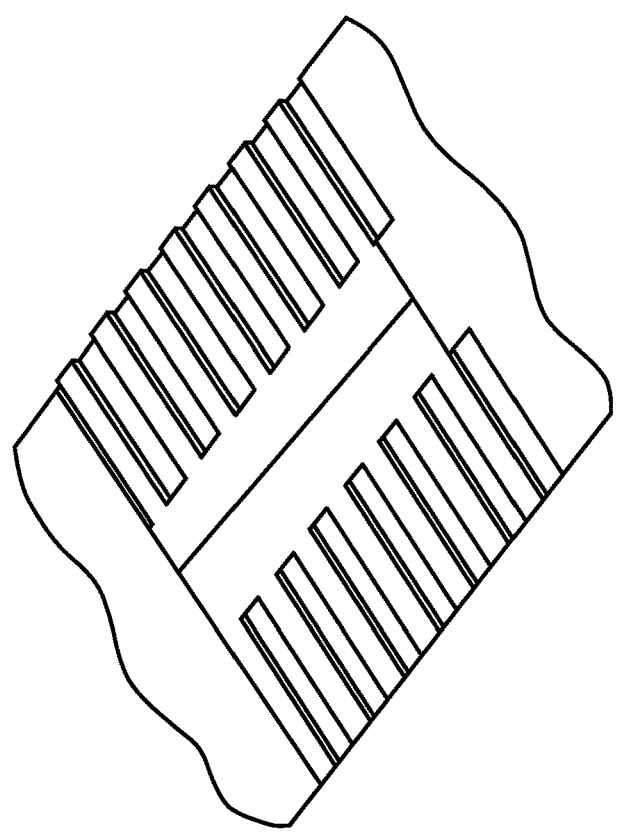

In another embodiment, the MEMS-tuned resonator is a double IDC. In the double IDC, there are IDC fingers on both sides of the iris and patch elements. FIGS. 22 and 23 illustrate an example of a double IDC. This configuration doubles the tunability because there are fingers on both sides and thus the overlap area occurs on both sides. The principle of operation for the double IDC is the same as described above. The patch element is displaced laterally with the MEMS actuator to variably adjust the position of the patch fingers between states of overlapping or not overlapping the fingers on the iris element.

Figure 24A:
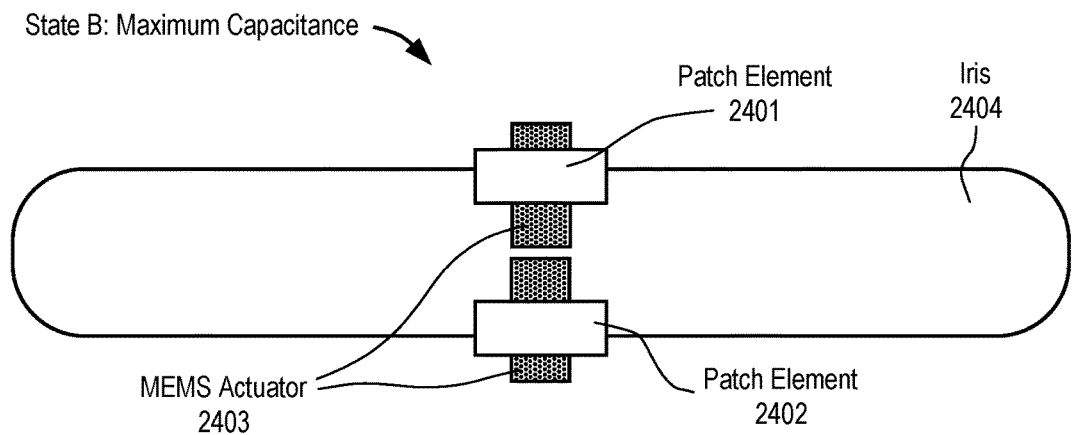
FIGS. 24A and 24B illustrate one embodiment of a MEMS-tuned resonator with a split patch.
Figure 24B:
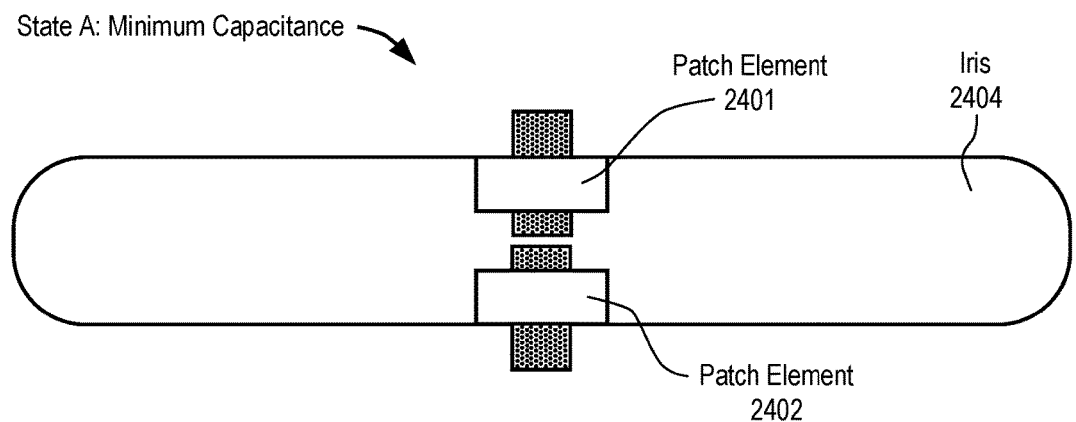

In yet another embodiment, the MEMS-tuned resonator has a patch element located over the center of the iris, where the patch element is split. FIGS. 24A and 24B illustrate one embodiment of a MEMS-tuned resonator with a split patch. Referring to FIGS. 24A and 24B, the two patch elements 2401 and 2402 are pulled outward towards the edges of iris 2404 using a MEMS actuator 2403 so that there is maximum overlap between the patch and metal plane that defines the plane of iris slot 2404. State B illustrates a maximum capacitance condition. Patch elements 2401 and 2402 can also be pulled in towards the center of the slot using MEMS actuator 2403, such that there is no overlap between patch elements 2401 and 2402 and the plane of iris 2404. State A is the minimum capacitance condition.

Figure 25:
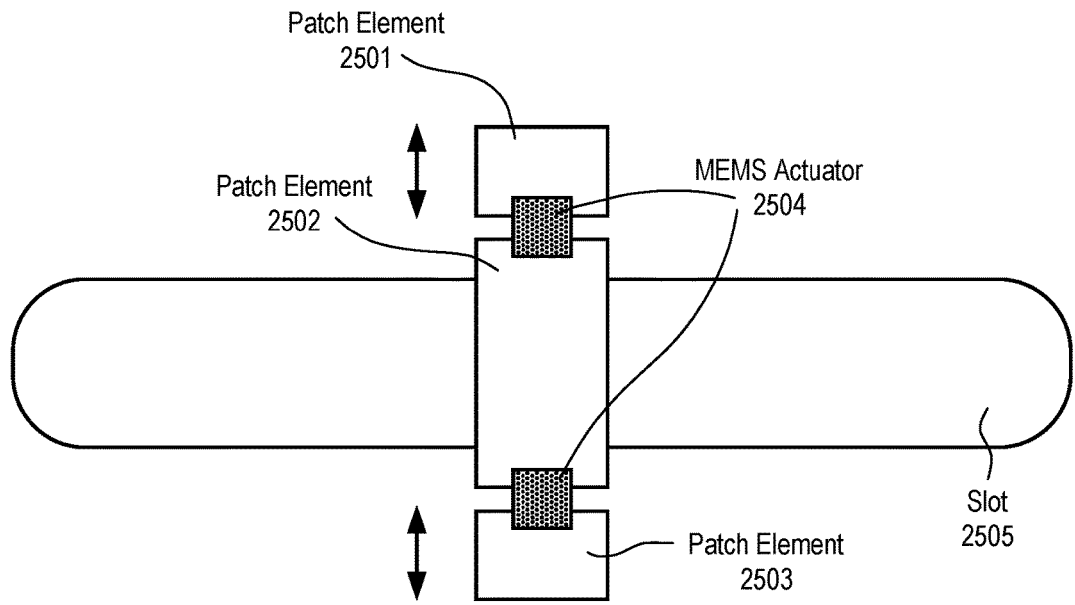
FIG. 25 illustrates an example of splitting the patch into three elements.

In one embodiment, the patch is split into more than two elements. FIG. 25 illustrates an example of splitting the patch into three elements. Referring to FIG. 25, patch elements 2501-2503 are shown in relation to slot 2505. MEMS actuators 2504 are able to move patch elements 2501-2503 closer to each other or farther away from each other. In one embodiment, there is a MEMS actuator associated with each of patch elements 2501-2503. The capacitance across the gaps between patch component 2502 and patch elements 2501 and 2503 on the edge is tuned by adjusting the lateral displacement of the MEMS actuators 2504.

Figure 26A:
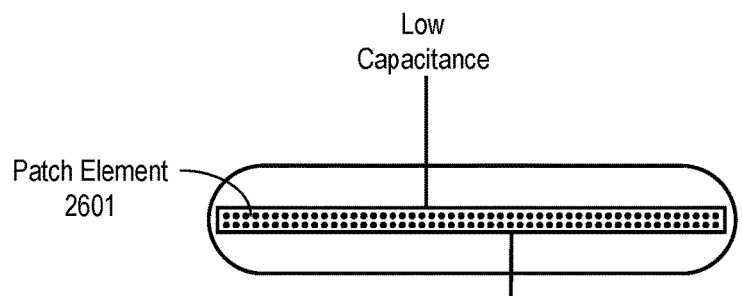
FIGS. 26A and 26B illustrate an example of a patch element rotated with respect to an iris.
Figure 26B:
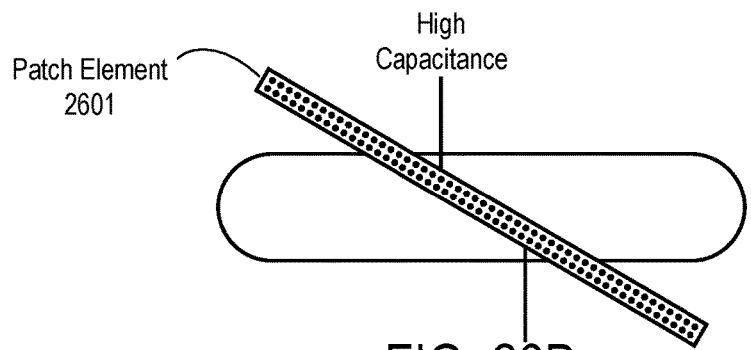

In yet another embodiment, capacitive tuning is achieved by rotating a patch element across the iris. FIGS. 26A and 26B illustrate an example of a patch element rotated with respect to an iris. Referring to FIG. 26A, patch element 2601 is shown lined up within and parallel to the slot. Referring to FIG. 26B, patch element 2601 is shown rotated across the slot. In one embodiment, the rotation is performed by a MEMS actuator (not shown). Because the traveling distance is large, yet compact, the MEMS actuator may be a thermal actuator. Note that the rotation occurs dynamically to capacitively tune the patch/iris pair.

Inductive Tuning Embodiments

In one embodiment, the MEMS-tuned resonator tunes the inductance of the slot. There are various ways in which the inductance of the slot can be tuned to change the resonance frequency. In the un-tuned state, the arms of the patch do not overlap the iris metallization.

In another embodiment, the MEMS-tuned resonator tunes the inductance of the slot using slot length tuning. In slot length tuning, the inductance of the slot is altered by laterally displacing the patch element from the edge of the slot in towards the center of the slot. An example of slot length tuning is shown in FIGS. 27A-C. Referring to FIG. 27A-C, patch element 2701 is moved from a first position in which it does not overlap slot 2702 at all (FIG. 27A), to a second position in which it begins to overlap slot 2702 (FIG. 27B) to a third position in which it almost covers half of slot 2702 (FIG. 27C). In one embodiment, the overlap depends on the tuning range, and the traveling distance provided by the actuator. Note that the overlap is performed by moving the patch with an actuator (not shown). In one embodiment, a large traveling distance MEMS actuator, e.g., thermal or comb-drive actuator, is used.

In another embodiment, the patch elements are shifted laterally across a slot in a direction more perpendicular to the slot. This is referred to herein as band shifting. By laterally shifting the patch elements across the iris in this manner, the resonant frequency of the slot can be significantly adjusted by shorting across the slot and changing the effective length of the slot. In this fashion, it is possible to cover a frequency span, such as, for example, a span from Ku to Ka.

Figure 28A:
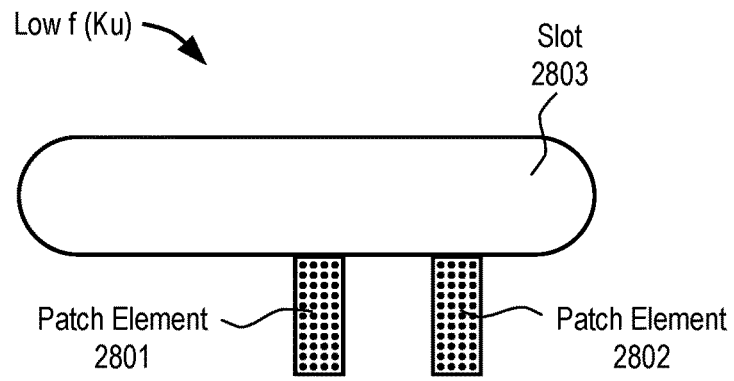
FIGS. 28A-C illustrate three examples of positions of patch elements with respect to the slot.
Figure 28B:
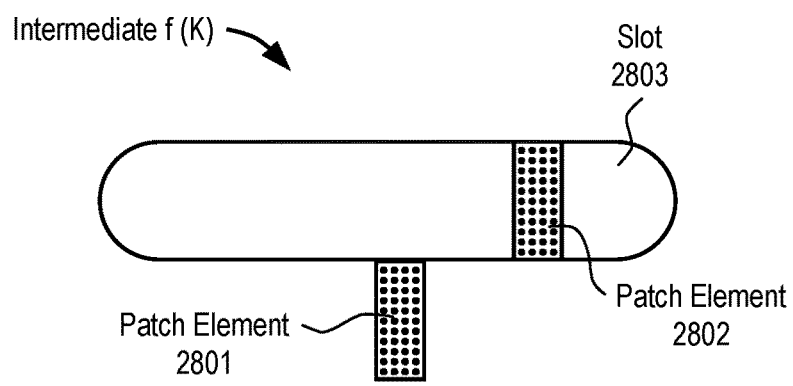
Figure 28C:
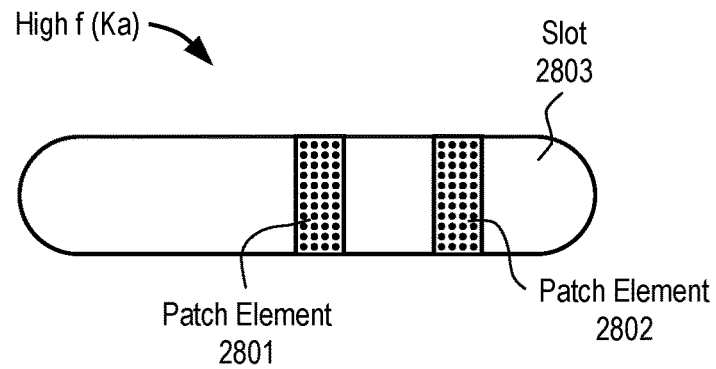

FIGS. 28A-C illustrate three examples of positions of patch elements with respect to the slot. FIG. 28A illustrates patch elements 2801 and 2802 located adjacent and perpendicular to slot 2803 but not overlapping slot 2803. FIG. 28B illustrates patch element 2801 adjacent and perpendicular to slot 2803 but not overlapping slot 2803 while patch element 2802 is positioned over and perpendicular to slot 2803. Lastly, FIG. 28C illustrates both patch elements 2801 and 2802 positioned over and perpendicular to slot 2803.

MEMS actuators move patch elements 2801-2803 in FIGS. 28A-C. In one embodiment, there is a MEMS actuator for each of patch elements 2801-2803. In another embodiment, one MEMS actuator controls more than one of patch elements 2801-2803.

There are a number of advantages in using the RF resonators described herein over an LC-tuned resonator, including, but not limited to roughly 100 usec switching times; insignificant temperature dependency in the tuning; a reduction of RF losses because there is no longer LC; and an increased tunability, which can be traded off in the design process for resonator geometries with increased efficiency.

Resonator Control

The amount of radiated power from each resonator is controlled by applying a voltage to the patch using a controller. Traces to each patch are used to provide the voltage to the patch antenna. The voltage is used to tune or detune the capacitance and thus the resonance frequency of individual elements to effectuate beam forming. The voltage required is dependent on the MEMS structure being used.

In one embodiment, a matrix drive is used to apply voltage to the patches in order to drive each antenna element separately from all the other antenna elements without having a separate connection for each patch/iris pair (direct drive). Because of the high density of elements, the matrix drive is an efficient way to address each patch/iris pair individually.

In one embodiment, the control structure for the antenna system has two main components: the antenna array controller, which includes drive electronics for the antenna system, is below the wave scattering structure, while the matrix drive switching array is interspersed throughout the radiating RF array in such a way as to not interfere with the radiation. In one embodiment, the drive electronics for the antenna system comprise commercial off-the-shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which patch/iris pairs are turned off and those patch/iris pairs are turned on and at which phase and amplitude level at the frequency of operation. The patch/iris pairs are selectively detuned for frequency operation by voltage application.

For transmission, a controller supplies an array of voltage signals to the RF patches to create a modulation, or control pattern. The control pattern causes the patch/iris pairs to be tuned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some patch/iris pairs radiate more strongly than others, rather than some patch/iris pairs radiate and some do not. Variable radiation is achieved by applying specific voltage levels, which adjusts membrane to varying amounts, thereby detuning patch/iris pairs variably and causing some patch/iris pairs to radiate more than others.

The generation of a focused beam by the array of patch/iris pairs can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that patch/iris pair will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which patch/iris pairs are turned on or off (i.e., by changing the pattern of which patch/iris pairs are turned on and which patch/iris pairs are turned off), a different pattern of constructive and destructive interference can be produced, and the antenna can change the direction of the main beam. The time required to turn the patch/iris pairs on and off dictates the speed at which the beam can be switched from one location to another location.

In one embodiment, the antenna system produces one steerable beam for the uplink antenna and one steerable beam for the downlink antenna. In one embodiment, the antenna system receives beams and decodes signals from the satellite and forms transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Patch/Iris Pair Placement

Figure 29:
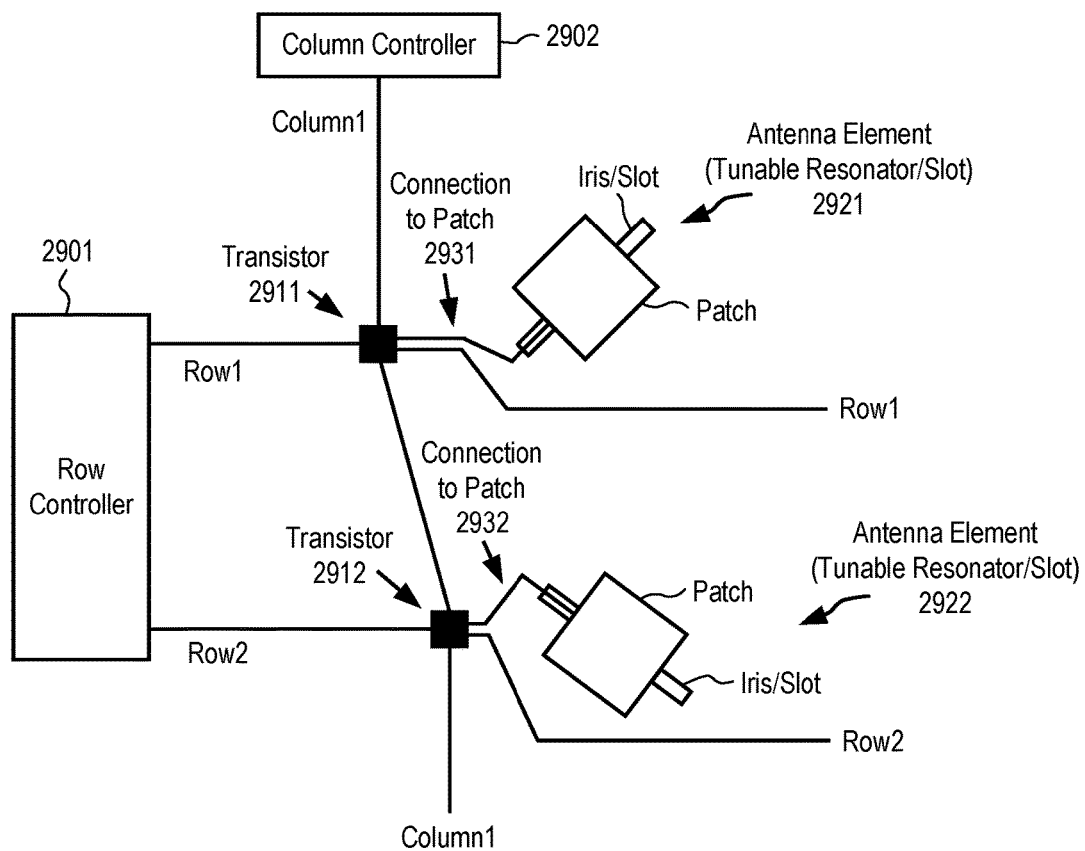
FIG. 29 illustrates one embodiment of the placement of matrix drive circuitry with respect to antenna elements.

In one embodiment, the antenna elements (patch/iris pairs) are placed on the cylindrical feed antenna aperture in a way that allows for a systematic matrix drive circuit. The placement of the antenna elements includes placement of the transistors for the matrix drive. FIG. 29 illustrates one embodiment of the placement of matrix drive circuitry with respect to antenna elements. Referring to FIG. 29, row controller 2901 is coupled to transistors 2911 and 2912, via row select signals Row1 and Row2, respectively, and column controller 2902 is coupled to transistors 2911 and 2912 via column select signal Column1. Transistor 2911 is also coupled to antenna element 2921 via connection to patch 2931, while transistor 2912 is coupled to antenna element 2922 via connection to patch 2932.

In an initial approach to realize matrix drive circuitry on the cylindrical feed antenna with antenna elements placed in a non-regular grid, two steps are performed. In the first step, the antenna elements are placed on concentric rings and each of the antenna elements is connected to a transistor that is placed beside the antenna element and acts as a switch to drive each antenna element separately. In the second step, the matrix drive circuitry is built in order to connect every transistor with a unique address as the matrix drive approach requires. Because the matrix drive circuit is built by row and column traces (similar to LCDs) but the antenna elements are placed on rings, there is no systematic way to assign a unique address to each transistor. This mapping problem results in very complex circuitry to cover all the transistors and leads to a significant increase in the number of physical traces to accomplish the routing. Because of the high density of antenna elements, those traces disturb the RF performance of the antenna due to coupling effect. Also, due to the complexity of traces and high packing density, the routing of the traces cannot be accomplished by commercially available layout tools.

In one embodiment, the matrix drive circuitry is predefined before the antenna elements and transistors are placed. This ensures a minimum number of traces that are necessary to drive all the antenna elements, each with a unique address. This strategy reduces the complexity of the drive circuitry and simplifies the routing, which subsequently improves the RF performance of the antenna.

More specifically, in one approach, in the first step, the antenna elements are placed on a regular rectangular grid composed of rows and columns that describe the unique address of each antenna element. In the second step, the antenna elements are grouped and transformed to concentric circles while maintaining their address and connection to the rows and columns as defined in the first step. A goal of this transformation is not only to put the antenna elements on rings but also to keep the distance between antenna elements and the distance between rings constant over the entire aperture. In order to accomplish this goal, there are several ways to group the antenna elements.

Figure 30:
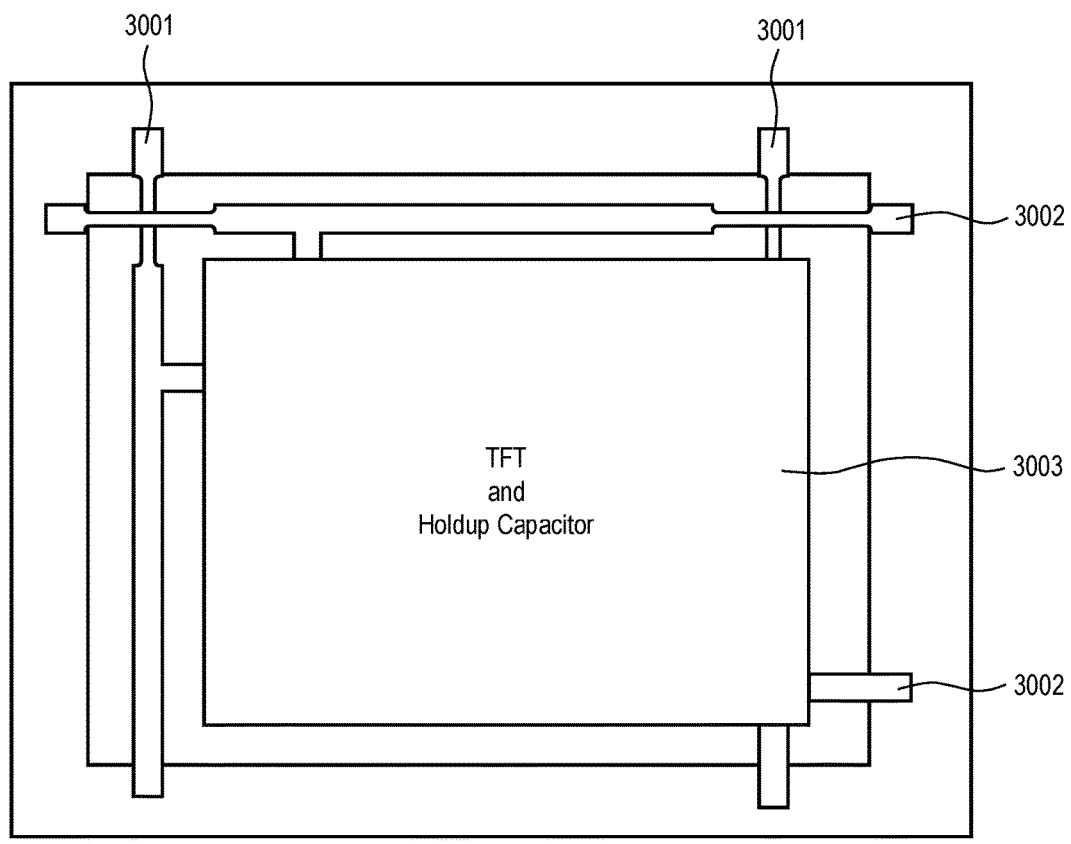
FIG. 30 illustrates one embodiment of a TFT package.

In one embodiment, a TFT package is used to enable placement and unique addressing in the matrix drive. FIG. 30 illustrates one embodiment of a TFT package. Referring to FIG. 30, a TFT and a holdup capacitor 3003 is shown with input and output ports. There are two input ports connected to traces 3001 and two output ports connected to traces 3002 to connect the TFTs together using the rows and columns. In one embodiment, the row and column traces cross in 90° angles to reduce, and potentially minimize, the coupling between the row and column traces. In one embodiment, the row and column traces are on different layers.

Example Position of Elements

FIGS. 31A-D illustrate one embodiment of the different layers for creating the slotted array. The antenna array includes antenna elements that are positioned in rings, such as the example rings shown in FIG. 1. Note that in this example the antenna array has two different types of antenna elements that are used for two different types of frequency bands.

Figures 31A, 31B:
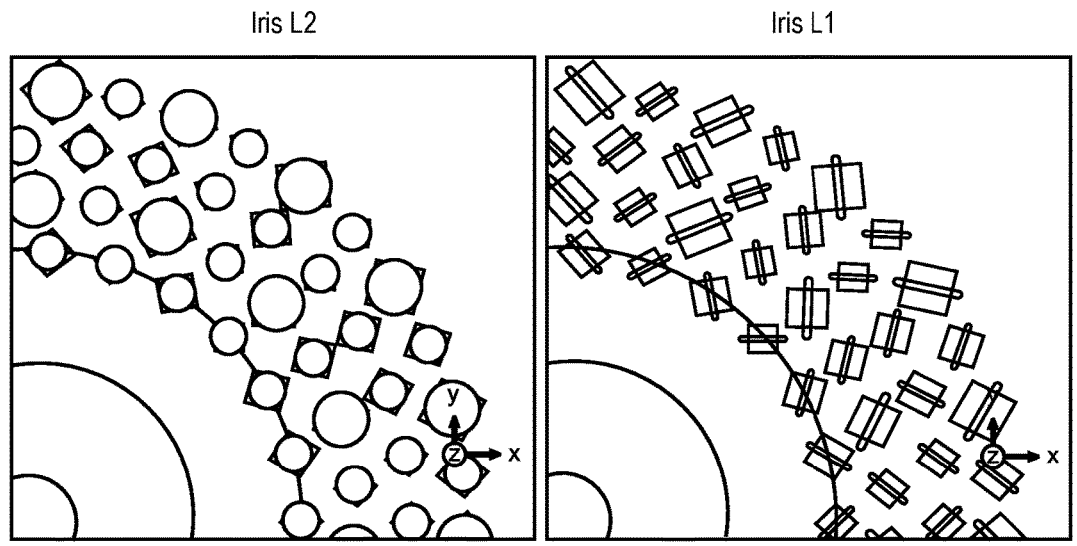
FIGS. 31A-D illustrate one embodiment of the different layers for creating the slotted array.
Figures 31C, 31D:
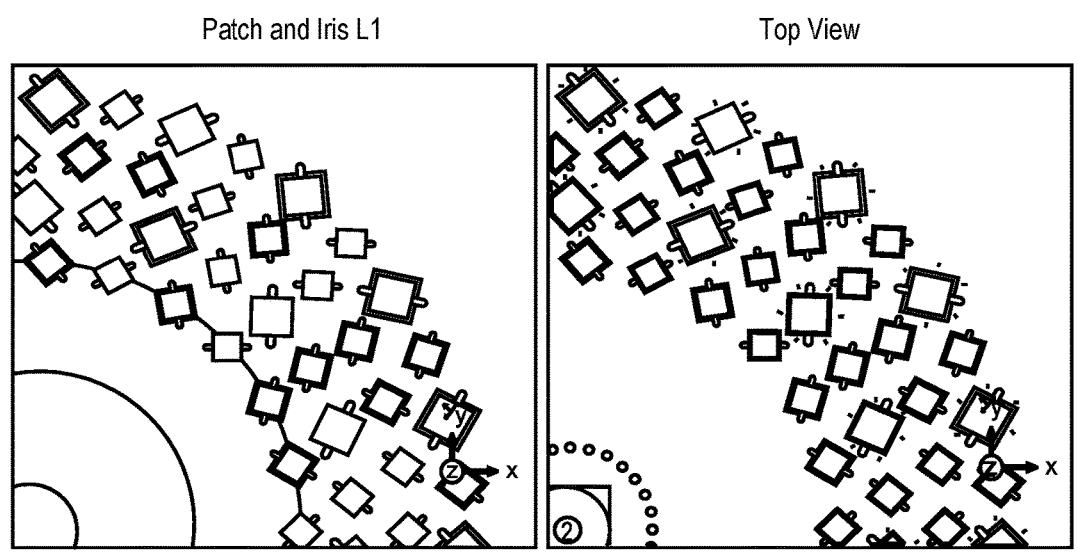

FIG. 31A illustrates a portion of the first iris board layer with locations corresponding to the slots. Referring to FIG. 31A, the circles are open areas/slots in the metallization in the bottom side of the iris substrate, and are for controlling the coupling of elements to the feed (the feed wave). Note that this layer is an optional layer and is not used in all designs. FIG. 31B illustrates a portion of the second iris board layer containing slots. FIG. 31C illustrates patches over a portion of the second iris board layer. FIG. 31D illustrates a top view of a portion of the slotted array.

An Example System Embodiment

In one embodiment, the combined antenna apertures are used in a television system that operates in conjunction with a set top box. For example, in the case of a dual reception antenna, satellite signals received by the antenna are provided to a set top box (e.g., a DirecTV receiver) of a television system. More specifically, the combined antenna operation is able to simultaneously receive RF signals at two different frequencies and/or polarizations. That is, one sub-array of elements is controlled to receive RF signals at one frequency and/or polarization, while another sub-array is controlled to receive signals at another, different frequency and/or polarization. These differences in frequency or polarization represent different channels being received by the television system. Similarly, the two antenna arrays can be controlled for two different beam positions to receive channels from two different locations (e.g., two different satellites) to simultaneously receive multiple channels.

Figure 32A:
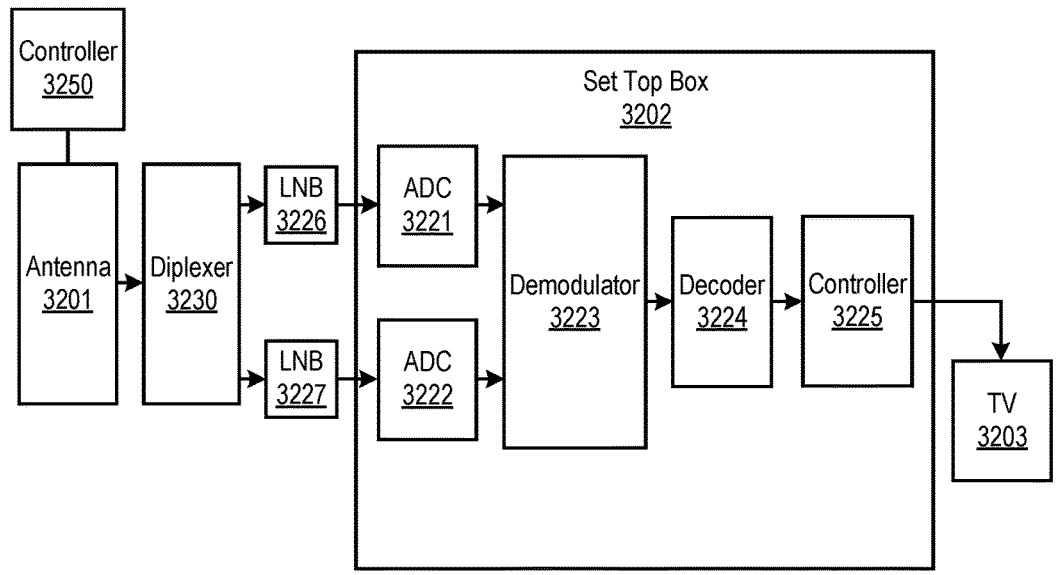
FIG. 32A is a block diagram of one embodiment of a communication system that performs dual reception simultaneously in a television system.

FIG. 32A is a block diagram of one embodiment of a communication system that performs dual reception simultaneously in a television system. Referring to FIG. 32A, antenna 3201 includes two spatially interleaved antenna apertures operable independently to perform dual reception simultaneously at different frequencies and/or polarizations as described above. Note that while only two spatially interleaved antenna operations are mentioned, the TV system may have more than two antenna apertures (e.g., 3, 4, 5, etc. antenna apertures).

In one embodiment, antenna 3201, including its two interleaved slotted arrays, is coupled to diplexer 3230. The coupling may include one or more feeding networks that receive the signals from elements of the two slotted arrays to produce two signals that are fed into diplexer 3230. In one embodiment, diplexer 3230 is a commercially available diplexer (e.g., model PB1081WA Ku-band sitcom diplexer from Al Microwave).

Diplexer 3230 is coupled to a pair of low noise block down converters (LNBs) 3226 and 3227, which perform a noise filtering function, a down conversion function, and amplification in a manner well-known in the art. In one embodiment, LNBs 3226 and 3227 are in an out-door unit (ODU). In another embodiment, LNBs 3226 and 3227 are integrated into the antenna apparatus. LNBs 3226 and 3227 are coupled to a set top box 3202, which is coupled to television 3203.

Set top box 3202 includes a pair of analog-to-digital converters (ADCs) 3221 and 3222, which are coupled to LNBs 3226 and 3227, to convert the two signals output from diplexer 3230 into digital format.

Once converted to digital format, the signals are demodulated by demodulator 3223 and decoded by decoder 3224 to obtain the encoded data on the received waves. The decoded data is then sent to controller 3225, which sends it to television 3203.

Controller 3250 controls antenna 3201, including the interleaved slotted array elements of both antenna apertures on the single combined physical aperture.

An Example of a Full Duplex Communication System

Figure 32B:
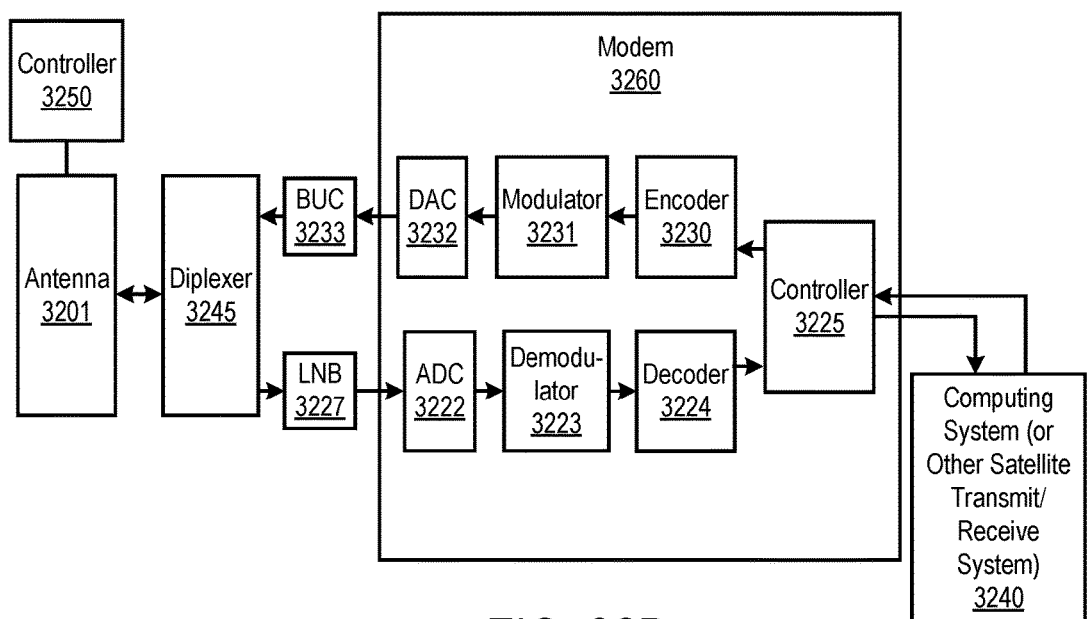
FIG. 32B is a block diagram of another embodiment of a communication system having simultaneous transmit and receive paths.

In another embodiment, the combined antenna apertures are used in a full duplex communication system. FIG. 32B is a block diagram of another embodiment of a communication system having simultaneous transmit and receive paths. While only one transmit path and one receive path are shown, the communication system may include more than one transmit path and/or more than one receive path.

Referring to FIG. 32B, antenna 3201 includes two spatially interleaved antenna arrays operable independently to transmit and receive simultaneously at different frequencies as described above. In one embodiment, antenna 3201 is coupled to diplexer 3245. The coupling may be by one or more feeding networks. In one embodiment, in the case of a radial feed antenna, diplexer 3245 combines the two signals and the connection between antenna 3201 and diplexer 3245 is a single broad-band feeding network that can carry both frequencies.

Diplexer 3245 is coupled to a low noise block down converter (LNBs) 3227, which performs a noise filtering function and a down conversion and amplification function in a manner well-known in the art. In one embodiment, LNB 3227 is in an out-door unit (ODU). In another embodiment, LNB 3227 is integrated into the antenna apparatus. LNB 3227 is coupled to a modem 3260, which is coupled to computing system 3240 (e.g., a computer system, modem, etc.).

Modem 3260 includes an analog-to-digital converter (ADC) 3222, which is coupled to LNB 3227, to convert the received signal output from diplexer 3245 into digital format. Once converted to digital format, the signal is demodulated by demodulator 3223 and decoded by decoder 3224 to obtain the encoded data on the received wave. The decoded data is then sent to controller 3225, which sends it to computing system 3240.

Modem 3260 also includes an encoder 3230 that encodes data to be transmitted from computing system 3240. The encoded data is modulated by modulator 3231 and then converted to analog by digital-to-analog converter (DAC) 3232. The analog signal is then filtered by a BUC (up-convert and high pass amplifier) 3233 and provided to one port of diplexer 3245. In one embodiment, BUC 3233 is in an out-door unit (ODU).

Diplexer 3245 operating in a manner well-known in the art provides the transmit signal to antenna 3201 for transmission.

Controller 3250 controls antenna 3201, including the two arrays of antenna elements on the single combined physical aperture.

Note that the full duplex communication system shown in FIG. 32B has a number of applications, including but not limited to, internet communication, vehicle communication (including software updating), etc.

There are a number of example embodiments described herein, some of which are described below.

Example 1 is an antenna comprising a physical antenna aperture having an array of antenna elements, wherein the array of antenna elements comprises a plurality of radio-frequency (RF) resonators, and each RF resonator of the plurality of RF resonators comprises an RF radiating element with a microelectromechanical systems (MEMS) device.

Example 2 is the antenna of example 1 that optionally includes that a resonance frequency of each resonator in the plurality of RF resonators is tuned between known levels using at least one push-pull parallel plate tunable capacitor.

Example 3 is the antenna of example 21 that optionally includes that the at least one push-pull parallel plate tunable capacitor comprises: a first substrate with a first electrode attached thereto; a second substrate with a second electrode attached thereto; a membrane between the first and second electrodes, the membrane being movable between the first and second electrodes in order to change the capacitance.

Example 4 is the antenna of example 3 that optionally includes that the membrane is pushed toward the first electrode or pulled toward the second electrode in order to change the capacitance based on voltages applied to the first and second electrodes.

Example 5 is the antenna of example 4 that optionally includes that the membrane is suspended in between the first and second electrodes when inactive, is pushed toward the first electrode thereby increasing a gap between the membrane and the second electrode and inserting a first capacitance in a resonator RF path passing the second electrode, and is pulled toward the second electrode thereby inserting a second capacitance in the resonator RF path that is greater than the first capacitance and consequently decreasing the resonance frequency.

Example 6 is the antenna of example 4 that optionally includes that the first electrode is at a first voltage and the second electrode is at a second voltage and the membrane toggles between the first and second voltages.

Example 7 is the antenna of example 3 that optionally includes that the first substrate comprises a patch of a patch/iris pair, the second substrate comprises an iris of a patch/iris pair.

Example 8 is the antenna of example 7 that optionally includes that capacitance between the iris and the membrane changes as the membrane is pulled up and down due to a change in voltage of the membrane.

Example 9 is the antenna of example 7 that optionally includes that the patch is co-located over and separated from the iris, forming the patch/iris pair that is turned off or on, and that the patch/iris pair is one of a plurality of patch/iris pairs in the aperture, and further comprising a controller to apply a control pattern to control which patch/iris pairs of the plurality of patch/iris pairs are on and off, thereby causing generation of a beam.

Example 10 is the antenna of example 7 that optionally includes that the first and second electrodes are attached to the first and second substrates respectively, and further wherein dielectric layers covers portions of the first and second electrodes to prevent the membrane from directly contacting the first and second electrodes when the membrane is pulled up and down due to a change in voltage of the membrane.

Example 11 is the antenna of example 3 that optionally includes that the first and second substrates are separated by a gap.

Example 12 is the antenna of example 11 that optionally includes that the gap is defined by one or more spacers between the first and second substrates.

Example 13 is the antenna of example 1 that optionally includes that each of the plurality of RF resonators comprises: a patch and slot that form a patch/slot pair; and a MEMS actuator to change position of the patch and the iris with respect to each other to change capacitance and/or inductance of said each resonator.

Example 14 is the antenna of example 13 that optionally includes that the actuator is operable to move the patch to change the capacitance and/or inductance of said each resonator.

Example 15 is the antenna of example 13 that optionally includes that patch/slot pairs of the plurality of RF resonators are controlled and operable together to form a beam for the frequency band for use in holographic beam steering.

Example 16 is the antenna of example 13 that optionally includes that the patch comprises a plurality of conductive spaced fingers and the slot comprises a plurality of spaced conductive protrusions, and wherein the actuator is operable to adjust overlap between the plurality of conductive fingers and the plurality of conductive protrusions to adjust the capacitance.

Example 17 is the antenna of example 16 that optionally includes that the plurality of conductive fingers and the plurality of conductive protrusions comprises metal or semiconductive material.

Example 18 is the antenna of example 16 that optionally includes that the plurality of conductive fingers are on opposite sides of the patch and the plurality of conductive protrusions are on opposite sides of the slot.

Example 19 is the antenna of example 13 that optionally includes that the patch comprises a plurality of patch elements, and the actuator adjusts one or more patch elements of the plurality of patch elements to change gap sizes between adjacent patch elements to tune the capacitance.

Example 20 is the antenna of example 19 that optionally includes that the plurality of patch elements comprises three patch elements with a first patch element being positioned between, and separated by gaps from, two edge patch elements, and wherein the actuator is operable to move one or both of the two edge patch elements with respect to the first patch element to change sizes of the gaps to change capacitance across the gaps when tuning.

Example 21 is the antenna of example 13 that optionally includes that the actuator is operable to rotate the patch across the iris.

Example 22 is the antenna of example 13 that optionally includes that the actuator is operable to laterally displace the patch with respect to the slot to tune the RF resonator.

Example 23 is the antenna of example 22 that optionally includes that the actuator laterally displaces the patch from an edge of the slot towards a center of the slot to tune the RF resonator.

Example 24 is the antenna of example 22 that optionally includes that the patch comprises a plurality of patch elements and one or more actuators laterally displace the patch elements from a side of the slot in a direction across the slot to tune the RF resonator.

Example 25 is an antenna comprising a physical antenna aperture having an array of antenna elements, wherein the array of antenna elements comprises a plurality of radio-frequency (RF) resonators, where each RF resonator of the plurality of RF resonators comprises an RF radiating element with at least one push-pull parallel plate tunable capacitor comprising: a patch, of a patch/iris pair, with a first electrode attached thereto; a iris, of the patch/iris pair, with a second electrode attached thereto; and a membrane between the first and second electrodes, the membrane being movable between the first and second electrodes in order to change the capacitance, wherein capacitance between the iris and the membrane changes as the membrane is pulled up and down due to a change in voltage of the membrane.

Example 26 is an antenna comprising: a physical antenna aperture having an array of antenna elements, wherein the array of antenna elements comprises a plurality of radio-frequency (RF) resonators, where each RF resonator of the plurality of RF resonators comprises an RF radiating element with a microelectromechanical systems (MEMS) device, wherein the plurality of RF resonators are controlled and operable together to form a beam for the frequency band for use in holographic beam steering.

Example 27 is a tunable capacitor for tuning an RF resonator comprising: a first substrate with a first electrode attached thereto; a second substrate with a second electrode attached thereto; and a membrane between the first and second electrodes, the membrane being movable between the first and second electrodes in order to change capacitance.

Example 28 is the tunable capacitor of example 27 that optionally includes that the membrane is pushed toward the first electrode or pulled toward the second electrode in order to change the capacitance between the membrane and each of the first and second electrodes based on voltages applied to the first and second electrodes.

Example 29 is the tunable capacitor of example 28 that optionally includes that the membrane is suspended in between the first and second electrodes when inactive, is pushed toward the first electrode thereby increasing a gap between the membrane and the second electrode and inserting a first capacitance in a resonator RF path passing the second electrode, and is pulled toward the second electrode thereby inserting a second capacitance in the resonator RF path that is greater than the first capacitance and consequently decreasing the resonance frequency.

Example 30 is the tunable capacitor of example 28 that optionally includes that the first electrode is at a first voltage and the second electrode is at a second voltage and the membrane toggles between the first and second voltages.

Example 31 is the tunable capacitor of example 27 that optionally includes that the first substrate comprises a patch of a patch/iris pair, the second substrate comprises an iris of a patch/iris pair.

Example 32 is the tunable capacitor of example 31 that optionally includes that capacitance between the iris and the membrane changes as the membrane is pulled up and down due to a change in voltage of the membrane.

Example 33 is the tunable capacitor of example 31 that optionally includes that the patch is co-located over and separated from the iris, forming the patch/iris pair that is turned off or on; and further wherein the patch/iris pair is one of a plurality of patch/iris pairs in the aperture Example 34 is the tunable capacitor of example 31 that optionally includes that the first and second electrodes are attached to the first and second substrates respectively, and further wherein at least one dielectric layer covers at least a portion of either the first electrode or second electrode to prevent the membrane from directly contacting the first and second electrodes when the membrane is pulled up and down due to a change in voltage of the membrane.

Example 35 is the tunable capacitor of example 27 that optionally includes that the first and second substrates are separated by a gap.

Example 36 is the tunable capacitor of example 35 that optionally includes that the gap is defined by one or more spacers between the first and second substrates.

Example 37 is a tunable capacitor for tuning an RF resonator comprising: a first substrate with a first electrode attached thereto; a second substrate with a second electrode attached thereto and separate by a gap defined by one or more spacers between the first and second substrates; and a membrane between the first and second electrodes, the membrane being movable between the first and second electrodes in order to change capacitance, wherein the membrane is pushed toward the first electrode or pulled away from the first electrode in order to change the capacitance between the membrane and each of the first and second electrodes based on voltages applied to the first and second electrodes.

Example 38 is a process for forming a RF radiating element having a MEMS device, the process comprising: fabricating opposite electrodes on two separate substrates; fabricating a conductive membrane using a sacrificial layer and conductive layer deposited over the sacrificial layer; removing the sacrificial layer; aligning the two separate substrates; and attaching the two substrates together with a gap between them in which the conductive membrane is suspended therebetween when inactive.

Example 39 is the process of example 38 that optionally includes fabricating spacers between the two substrates to cause the gap to remain after the two substrates have been attached together.

Example 40 is the process of example 38 that optionally includes depositing dielectric layers over portions of the first and second electrodes to prevent the membrane from directly contacting the first and second electrodes when the membrane is pulled up and down due to a change in voltage of the membrane.

Example 41 is the process of example 38 that optionally includes that the first and second electrodes are attached to the first and second substrates respectively.

Example 42 is the process of example 38 that optionally includes fabricating spacers between the first and second substrates to define the gap.

Example 43 is the process of example 38 that optionally includes that the conductive membrane is metal or silicon.

Example 44 is the process of example 43 that optionally includes the metal comprises copper, aluminum, gold, or silver and the sacrificial layer comprises a photoresist, a metal, a dielectric or a polymer.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An antenna comprising:
   a physical antenna aperture having an array of antenna elements, wherein the array of antenna elements comprises a plurality of radio-frequency (RF) resonators, each RF resonator of the plurality of RF resonators comprising an RF radiating element with a microelectromechanical systems (MEMS) device, wherein a resonance frequency of each resonator in the plurality of RF resonators is tuned between known levels using at least one push-pull parallel plate tunable capacitor.

2. The antenna defined in claim 1 wherein the at least one push-pull parallel plate tunable capacitor comprises:
   a first substrate with a first electrode attached thereto;
   a second substrate with a second electrode attached thereto;
   a membrane between the first and second electrodes, the membrane being movable between the first and second electrodes in order to change the capacitance.

3. The antenna defined in claim 2 wherein the membrane is pushed toward the first electrode or pulled toward the second electrode in order to change the capacitance based on voltages applied to the first and second electrodes.

4. The antenna defined in claim 3 wherein the membrane is suspended in between the first and second electrodes when inactive, is pushed toward the first electrode thereby increasing a gap between the membrane and the second electrode and inserting a first capacitance in a resonator RF path passing the second electrode, and is pulled toward the second electrode thereby inserting a second capacitance in the resonator RF path that is greater than the first capacitance and consequently decreasing the resonance frequency.

5. The antenna defined in claim 3 wherein the first electrode is at a first voltage and the second electrode is at a second voltage and the membrane toggles between the first and second voltages.

6. The antenna defined in claim 2 wherein the first substrate comprises a patch of a patch/iris pair, the second substrate comprises an iris of a patch/iris pair.

7. The antenna defined in claim 6 wherein capacitance between the iris and the membrane changes as the membrane is pulled up and down due to a change in voltage of the membrane.

8. The antenna defined in claim 6 wherein the patch is co-located over and separated from the iris, forming the patch/iris pair that is turned off or on; and further wherein the patch/iris pair is one of a plurality of patch/iris pairs in the aperture, and further comprising a controller to apply a control pattern to control which patch/iris pairs of the plurality of patch/iris pairs are on and off, thereby causing generation of a beam.

9. The antenna defined in claim 6 wherein the first and second electrodes are attached to the first and second substrates respectively, and further wherein dielectric layers covers portions of the first and second electrodes to prevent the membrane from directly contacting the first and second electrodes when the membrane is pulled up and down due to a change in voltage of the membrane.

10. The antenna defined in claim 2 wherein the first and second substrates are separated by a gap.

11. The antenna defined in claim 10 wherein the gap is defined by one or more spacers between the first and second substrates.

12. An antenna comprising:
    a physical antenna aperture having an array of antenna elements, wherein the array of antenna elements comprises a plurality of radio-frequency (RF) resonators, each RF resonator of the plurality of RF resonators comprising an RF radiating element with a microelectromechanical systems (MEMS) device, wherein each of the plurality of RF resonators comprises:
    a patch and slot that form a patch/slot pair; and
    a MEMS actuator to change position of the patch and the iris with respect to each other to change capacitance and/or inductance of said each resonator.

13. The antenna defined in claim 12 wherein the actuator is operable to move the patch to change the capacitance and/or inductance of said each resonator.

14. The antenna defined in claim 12 wherein patch/slot pairs of the plurality of RF resonators are controlled and operable together to form a beam for the frequency band for use in holographic beam steering.

15. The antenna defined in claim 12 wherein the patch comprises a plurality of conductive spaced fingers and the slot comprises a plurality of spaced conductive protrusions, and wherein the actuator is operable to adjust overlap between the plurality of conductive fingers and the plurality of conductive protrusions to adjust the capacitance.

16. The antenna defined in claim 15 wherein the plurality of conductive fingers and the plurality of conductive protrusions comprises metal or semi-conductive material.

17. The antenna defined in claim 15 wherein the plurality of conductive fingers are on opposite sides of the patch and the plurality of conductive protrusions are on opposite sides of the slot.

18. The antenna defined in claim 12 wherein the patch comprises a plurality of patch elements, and the actuator adjusts one or more patch elements of the plurality of patch elements to change gap sizes between adjacent patch elements to tune the capacitance.

19. The antenna defined in claim 18 wherein the plurality of patch elements comprises three patch elements with a first patch element being positioned between, and separated by gaps from, two edge patch elements, and wherein the actuator is operable to move one or both of the two edge patch elements with respect to the first patch element to change sizes of the gaps to change capacitance across the gaps when tuning.

20. The antenna defined in claim 12 wherein the actuator is operable to rotate the patch across the iris.

21. The antenna defined in claim 12 wherein the actuator is operable to laterally displace the patch with respect to the slot to tune the RF resonator.

22. The antenna defined in claim 21 wherein the actuator laterally displaces the patch from an edge of the slot towards a center of the slot to tune the RF resonator.

23. The antenna defined in claim 21 wherein the patch comprises a plurality of patch elements and one or more actuators laterally displace the patch elements from a side of the slot in a direction across the slot to tune the RF resonator.

24. An antenna comprising:
- a physical antenna aperture having an array of antenna elements, wherein the array of antenna elements comprises a plurality of radio-frequency (RF) resonators, each RF resonator of the plurality of RF resonators comprising an RF radiating element with at least one push-pull parallel plate tunable capacitor comprising:
- a patch, of a patch/iris pair, with a first electrode attached thereto;
- a iris, of the patch/iris pair, with a second electrode attached thereto;
- a membrane between the first and second electrodes, the membrane being movable between the first and second electrodes in order to change the capacitance, wherein capacitance between the iris and the membrane changes as the membrane is pulled up and down due to a change in voltage of the membrane, and
- wherein a resonance frequency of each RF resonator in the plurality of RF resonators is tuned between known levels using at least one push-pull parallel plate tunable capacitor.

25. An antenna comprising:
- a physical antenna aperture having an array of antenna elements, wherein the array of antenna elements comprises a plurality of radio-frequency (RF) resonators, each RF resonator of the plurality of RF resonators comprising an RF radiating element with a microelectromechanical systems (MEMS) device, wherein the plurality of RF resonators are controlled and operable together to form a beam for the frequency band for use in holographic beam steering, and further wherein a resonance frequency of each resonator in the plurality of RF resonators is tuned between known levels using at least one push-pull parallel plate tunable capacitor.

* * * * *